(12) United States Patent
Kim et al.

(10) Patent No.: US 9,159,374 B2
(45) Date of Patent: Oct. 13, 2015

(54) FLASH MEMORY MODULE AND MEMORY SUBSYSTEM

(71) Applicant: NovaChips Canada Inc., Ottawa (CA)

(72) Inventors: Jin-Ki Kim, Ottawa (CA); DaeHee Yi, Seoul (KR); HyoShin Kim, Seoul (KR)

(73) Assignee: NovaChips Canada Inc., Ottawa (CA)

( * ) Notice: Subject to any disclaimer, the term of this patent is extended or adjusted under 35 U.S.C. 154(b) by 526 days.

(21) Appl. No.: 13/665,181

(22) Filed: Oct. 31, 2012

(65) Prior Publication Data

US 2013/0107443 A1     May 2, 2013

Related U.S. Application Data

(60) Provisional application No. 61/554,757, filed on Nov. 2, 2011.

(51) Int. Cl.
| | | |
|---|---|---|
| *G11C 5/04* | (2006.01) | |
| *G11C 7/10* | (2006.01) | |
| *H05K 5/00* | (2006.01) | |

(52) U.S. Cl.
CPC ............... *G11C 5/04* (2013.01); *G11C 7/1003* (2013.01)

(58) Field of Classification Search
CPC ........... G11C 5/143; G11C 5/04; H05K 5/00; H05K 5/0278
USPC ............. 361/679.01–679.45, 679.55–679.61, 361/785, 803, 724–727; 174/252, 260–262; 455/575.1–575.9; 349/56–60; 312/223.1–223.3
See application file for complete search history.

(56) References Cited

U.S. PATENT DOCUMENTS

| | | | |
|---|---|---|---|
| 6,614,664 B2 | 9/2003 | Lee | |
| 6,661,671 B1* | 12/2003 | Franke et al. | 361/752 |
| 6,678,747 B2* | 1/2004 | Goossen et al. | 710/2 |
| 7,420,608 B2* | 9/2008 | Yamasaki | 348/333.01 |
| 7,800,919 B2* | 9/2010 | Crabtree et al. | 361/803 |
| 7,952,882 B2* | 5/2011 | Biskeborn | 361/724 |
| 8,189,328 B2* | 5/2012 | Kanapathippillai et al. | 361/679.32 |
| 8,582,296 B2* | 11/2013 | Huang | 361/695 |
| 8,605,424 B2* | 12/2013 | Wallace et al. | 361/679.38 |
| 8,615,616 B2* | 12/2013 | Weiser et al. | 710/38 |
| 8,705,232 B2* | 4/2014 | Lin et al. | 361/679.47 |
| 2004/0052046 A1* | 3/2004 | Regimbal et al. | 361/687 |
| 2004/0143716 A1* | 7/2004 | Hong | 711/170 |
| 2004/0257759 A1* | 12/2004 | McDonald et al. | 361/684 |
| 2005/0021895 A1* | 1/2005 | Son et al. | 710/301 |

(Continued)

FOREIGN PATENT DOCUMENTS

| | | |
|---|---|---|
| CA | 2659828 | 2/2008 |
| CA | 2774396 | 3/2010 |
| WO | 2010043032 | 4/2010 |

*Primary Examiner* — Anthony Haughton
*Assistant Examiner* — Razmeen Gafur
(74) *Attorney, Agent, or Firm* — Shin Hung; Borden Ladner Gervais LLP

(57) ABSTRACT

A mass storage memory module system including a memory module having memory holding members which can be connected to each other, and removably connected to a memory controller. One or more modular memory holding members can be connected to each other to expand the overall storage capacity of the memory module. The presently described expandable memory module does not have a storage capacity limit. A memory holding member includes a plate, a plane, a board and another material having at least one memory device, or, on which at least one memory device is held or to which at least one memory device is mounted.

37 Claims, 25 Drawing Sheets

(56) References Cited

U.S. PATENT DOCUMENTS

| | | | |
|---|---|---|---|
| 2005/0160285 A1* | 7/2005 | Evans | 713/194 |
| 2008/0017718 A1* | 1/2008 | Jones et al. | 235/492 |
| 2008/0259555 A1* | 10/2008 | Bechtolsheim et al. | 361/686 |
| 2008/0278923 A1* | 11/2008 | Losavio et al. | 361/803 |
| 2009/0287879 A1* | 11/2009 | Oh et al. | 711/103 |
| 2010/0073860 A1* | 3/2010 | Moriai et al. | 361/679.32 |
| 2010/0118482 A1* | 5/2010 | Kim | 361/679.32 |
| 2010/0217910 A1* | 8/2010 | Bryant-Rich | 710/301 |
| 2011/0110165 A1 | 5/2011 | Gillingham et al. | |
| 2011/0149499 A1* | 6/2011 | Bandholz et al. | 361/679.31 |
| 2011/0235260 A1* | 9/2011 | Lee et al. | 361/679.32 |
| 2012/0236493 A1* | 9/2012 | Wallace et al. | 361/679.37 |

* cited by examiner

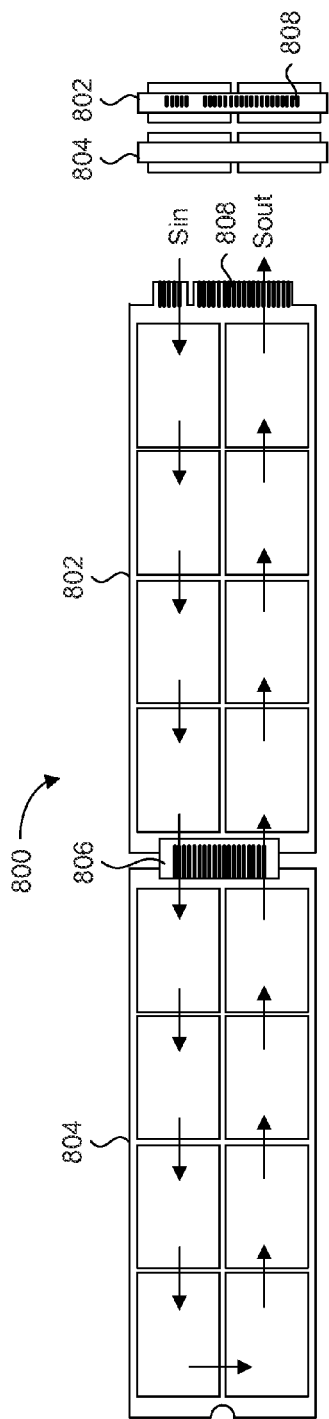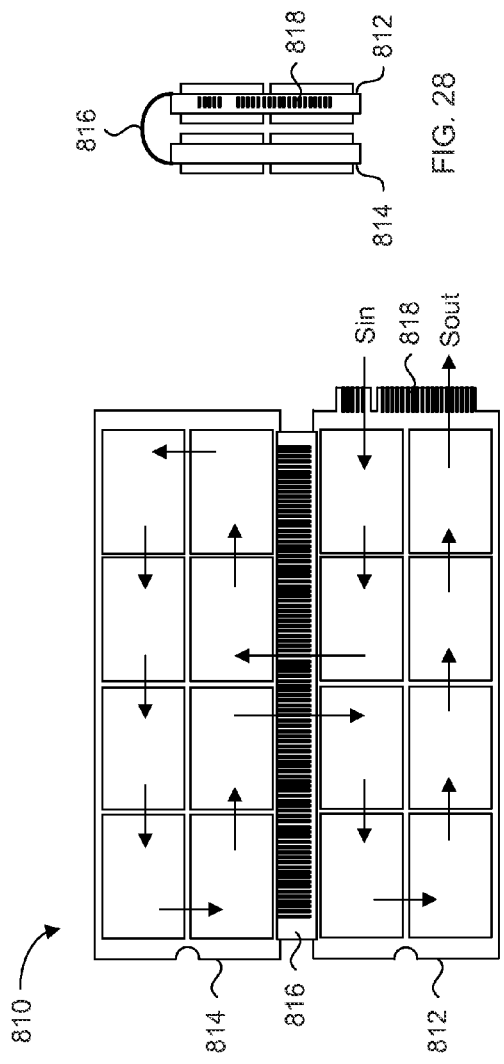

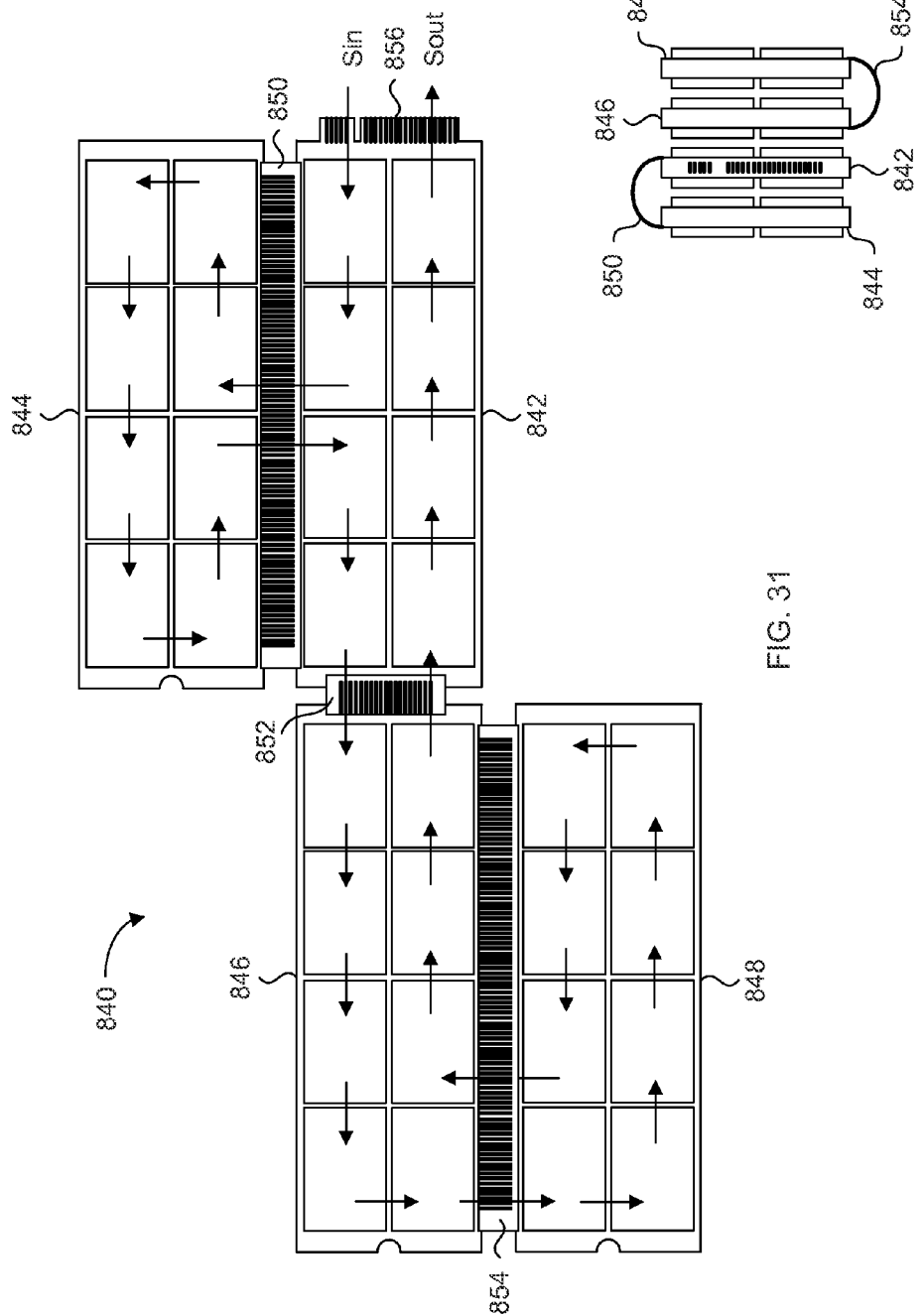

FLASH MEMORY MODULE AND MEMORY SUBSYSTEM

CROSS REFERENCE TO RELATED APPLICATIONS

This application claims the benefit of priority of U.S. Provisional Patent Application No. 61/554,757, filed on Nov. 2, 2011, the contents of which are incorporated herein by reference in their entirety.

FIELD

The present disclosure relates generally to memory systems. More particularly, the present disclosure relates to a mass storage memory system.

BACKGROUND

Flash memory is a commonly used type of non-volatile memory in widespread use as mass storage for consumer electronics, such as digital cameras and portable digital music players for example. Such flash memory take the form of memory cards or USB type memory sticks, each having at least one memory device and a memory controller formed therein. Another mass storage application is solid state drives (SSD) which can be used as replacements for computer hard disk drives. These solid state drives can be used in computer workstations, networks, and for virtually any application in which large amounts of data need to be stored. Cloud computing is an application where user data is stored in a virtual location in the Internet, as opposed to locally in a workstation or other local area network (LAN). It should be appreciated that progressively increasing amounts of mass storage are required as more and more users adopt cloud computing for storing their data.

Non-volatile mass storage can take the form of packaged memory devices mounted to printed circuit boards (PCB) having a connector interface for insertion into a complementary socket of a host system. These are also known as memory modules. These PCB's are shaped in size for receiving any number of memory devices, where the surface area of the PCB ultimately determines the total number of memory devices which can be mounted to the PCB, thereby determining the overall storage capacity of the memory module. A commonly known example of such memory modules are DRAM memory modules for use in a host system, such as a laptop or personal computer.

The problem with such memory modules is that they have a fixed memory storage capacity. Therefore if more memory storage is required, additional modules are added to the host system, provided of course the host system is configured to accept additional memory modules. Typically though, the existing memory module is replaced with a new memory module having an increased storage capacity. Memory module manufacturers are therefore faced with producing different memory modules, each having different storage capacities, in order to provide cost effective solutions for different users and systems. This problem is compounded by the fact that the memory device manufacturers continue to develop semiconductor memories with ever increasing densities, and/or techniques for increasing the number of memory devices within each memory package. Therefore, the memory module manufacturer is faced with the costs for developing new memory modules, which are ultimately passed to the consumer.

Furthermore, current non-volatile memory module architectures face a practical limit to the number of memory devices which can be connected to the PCB, regardless of the size of the PCB. Therefore, current non-volatile memory module architectures may not meet the increasing storage requirement demands of users who may wish to store their large multi-media files, such as, for example, audio and video files.

SUMMARY

According to a first aspect of the present invention, there is provided a memory module having at least two memory devices, a connection interface, and a member. The connection interface includes an input port and an output port. The member has signal traces configured to serially connect the at least two memory devices mounted to the member between the input port and the output port of the connection interface. The member can include a board. According to an embodiment of the first aspect, a first memory device of the at least two memory devices is configured to receive input signals from the input port, and a second memory device of the at least two memory devices is configured to provide output signals to the output port. According to another embodiment of the first aspect, the input port comprises a first channel input port and the output port comprises a first channel output port, and the connection interface comprises a second channel input port and a second channel output port. In this embodiment, the member includes further signal traces configured to serially connect additional memory devices mounted to the member between the second channel input port and the second channel output port.

In yet another embodiment of the first aspect, the at least two memory devices includes a first group of memory devices mounted to a first side of the member and a second group of memory devices mounted to a second side of the member. The signal traces are configured to propagate the input signals from the channel input port through each memory device of the first group of memory devices, and then through each memory device of the second group of memory devices. In this embodiment, the first group of memory devices includes a first memory device receiving the input signals from the channel input port, and a last memory device providing the input signals through to the second side of the member. The second group of memory devices includes a first memory device receiving the input signals from the last memory device of the first group of memory devices, and a last memory device providing the input signals to the channel output port.

In an alternate embodiment, the signal traces are configured to propagate the input signals in a stitching pattern through memory devices of the first group of memory devices and of the second group of memory devices. In this embodiment, a first memory device of the first group of memory devices receives the input signals from the channel input port, and a last memory device of the first group of memory devices provides the input signals to the channel output port.

In a second aspect, there is provided a solid state drive system. The system includes a memory controller and a memory module. The memory controller has a host interface and a channel. The memory module has a connection interface including a channel input port configured to receive input signals from the channel, and a channel output port configured to provide output signals to the channel. In an embodiment of the second aspect, the memory module includes at least two memory devices serially connected between the channel input port and the channel output port. In this embodiment, the memory module includes a member having signal traces configured to serially connect the at least two memory devices mounted to the member between the channel input port and the channel output port of the connection interface. The member can include a board.

In an alternate embodiment, the memory module includes a first board including the connection interface, and N second boards serially connected to each other and the first board, where N is an integer value of at least 1. The at least two memory devices are mounted to the first board and the N second boards and serially connected with each other between the channel input port and the channel output port. In another embodiment, the channel is a first channel and the memory controller is configured to include a second channel. For this embodiment, the board includes further signal traces configured to serially connect additional memory devices mounted to the board between the second channel input port and the second channel output port.

According to other embodiments of the second aspect, the memory module includes signal traces configured to connect the channel input port to the channel output port, or the memory module includes a driver circuit for repeating input signals received at the channel input port to the channel output port. Such a memory module can include test logic circuitry configured to test the input signals received at the channel input port.

In a third aspect, there is provided a memory module including a first memory holding member, a second memory holding member, and a connector. The first memory holding member includes a channel input port coupled to an output port by a first set of serially connected memory devices, and a channel output port coupled to an input port by a second set of serially connected memory devices. The second memory holding member includes a first port connected to a third set of serially connected memory devices, and a second port connected to a fourth set of serially connected memory devices. The connector is configured to electrically connect the channel output port to the first port and the channel input port to the second port.

According to an embodiment, the connector includes a flexible connector having a first end configured to electrically connect to terminals of the output port and the input port of the first memory holding member, and a second end configured to electrically connect to terminals of the first port and the second port of the second memory holding member, such that the first memory holding member is foldable over the second memory holding member in a stacked configuration. Alternately, the memory module can further include a first socket electrically connected to terminals of the open loop output port and the open loop input port of the first memory holding member, a second socket electrically connected to terminals of the first port and the second port of the second memory holding member, wherein the flexible connector has a first end releasably insertable into the first socket and a second end releasable insertable into the second socket. Alternately, the memory module can further include a socket electrically connected to terminals of the open loop output port and the open loop input port of the first memory holding member, wherein the flexible connector has a first end permanently connected to terminals of the first port and the second port of the second memory holding member, and a second end releasably insertable into the socket. The flexible connector can be a ribbon connector.

In yet another embodiment of the third aspect, the third set of serially connected memory devices and the fourth set of serially connected memory devices are serially connected between the first port and the second port. Alternately, the third set of serially connected memory devices are serially connected between the first port and a third port, and the fourth set of serially connected memory devices are serially connected between the second port and a fourth port. In this alternate embodiment, another connector is configured to electrically connect terminals of the third port to terminals of the fourth port, or a socket is connected to terminals of the third port and the fourth port such that another connector is releasably insertable into the socket and configured to electrically connect terminals of the third port to terminals of the fourth port. Alternately, the connector is a first connector, and the memory module further includes a third memory holding member having a fifth port connected to a fifth set of serially connected memory devices and a sixth port connected to a sixth set of serially connected memory devices, and a second connector configured to electrically connect the fifth port to the third port, and the sixth port to the fourth port.

In a fourth aspect, there is provided a memory module including a first memory holding member, N second memory holding members, and a plurality of memory devices. The first memory holding member has a connection interface including electrical terminals corresponding to a channel input port and a channel output port. The N second memory holding members are serially connected to each other and the first memory blade, where N is an integer value of at least 1. The plurality of memory devices are mounted to the first memory holding member and the N second memory holding members, and serially connected with each other between the channel input port and the channel output port and configured to propagate signals received at the channel input port through each of the plurality of memory devices. According to an embodiment of the fourth aspect, the first memory holding member is connected to one of the N second memory holding members with a flexible connector such that a set of the plurality of memory devices of the first memory holding member are serially connected with another set of the plurality of memory devices of the one of the N second memory holding members through the flexible connector.

According to an alternate embodiment, the first memory holding member and each of the N second memory holding members are connected to each other as a chain of memory blades with flexible connectors connected between each of the memory holding members, the plurality of memory devices mounted to the first memory holding member and the N second memory holding members being serially connected with each other through the flexible connectors. According to the present embodiments, the first memory holding member and each of the N second memory holding members are foldable over each other to form a stack. More specifically, the first memory holding member and each of the N second memory holding members are foldable in an accordion fold configuration.

In another embodiment of the fourth aspect, one of the N second memory holding members includes a memory extender having at least one socket configured to receive another first memory holding member.

BRIEF DESCRIPTION OF THE DRAWINGS

Embodiments of the present disclosure will now be described, by way of example only, with reference to the attached Figures.

FIG. 25 is a plan view diagram of an expandable memory module having two memory blades, according to an embodiment of the present invention;

FIG. 26 is a front view diagram of the expandable memory module of FIG. 25 in the folded configuration;

FIG. 27 is a plan view diagram of an alternate expandable memory module having two memory blades, according to an embodiment of the present invention;

FIG. 28 is a front view diagram of the multi-blade memory module of FIG. 27 in the folded configuration;

FIG. 31 is a plan view diagram of an alternate expandable memory module having four memory blades, according to an embodiment of the present invention;

FIG. 32 is a front view diagram of the expandable memory module of FIG. 31 in the folded configuration;

DETAILED DESCRIPTION

Generally, the present disclosure provides a mass storage memory module system including a memory module having memory holding members which can be connected to each other, and removably connected to a memory controller. One or more modular memory holding members can be connected to each other to expand the overall storage capacity of the memory module. The presently described expandable memory module does not have a storage capacity limit. In this disclosure, a memory holding member includes a plate, a plane, a board and another material having at least one memory device, or, on which at least one memory device is held or to which at least one memory device is mounted. One example of the memory holding member is a printed circuit board. In the following description, a particular example of the memory holding member is a printed circuit board (PCB) or a blade-shaped board (so called as "blade"). It would be apparent to those skilled in the art that the memory holding members are not limited to boards and blades.

Prior to a discussion of the expandable memory module, the current non-volatile memory module system is first described.

Figure 1:
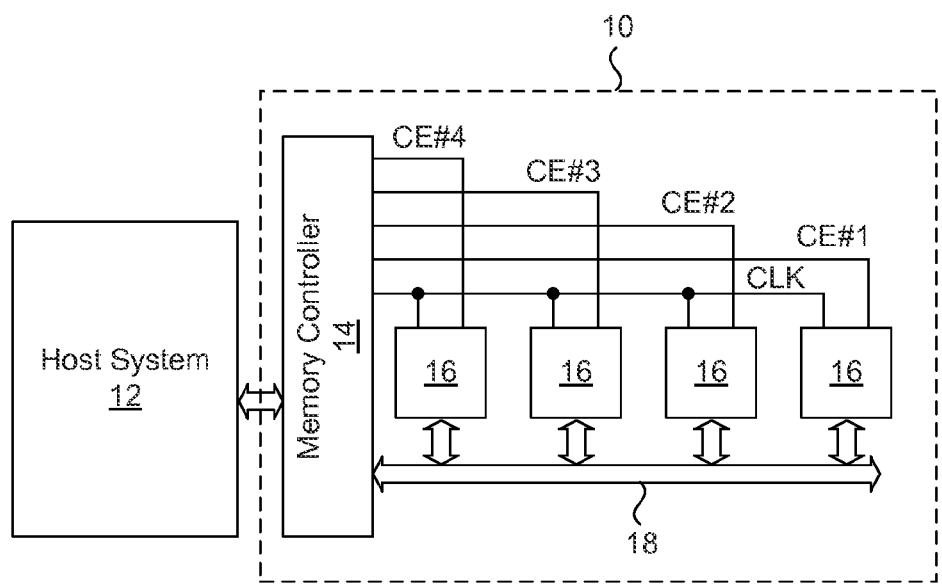
FIG. 1 is a block diagram of a prior art memory system.

FIG. 1 is a block diagram of a prior art flash memory system 10 integrated with a host system 12. Flash memory system 10 includes a memory controller 14 in communication with host system 12, and multiple non-volatile memory devices 16. The host system will include a processing device such as a microcontroller, microprocessor, or a computer system. The Flash memory system 10 of FIG. 1 is configured to include one channel 18, where memory devices 16 are connected in parallel to channel 18. Those skilled in the art will understand that the memory system 10 can have more or less than four memory devices connected to it.

Channel 18 includes a set of common buses, which include data and control lines that are connected to all its corresponding memory devices. Each memory device is enabled/disabled with respective chip select signals CE#1, CE#2, CE#3 and CE#4, provided by memory controller 14. The "#" indicates that the signal is an active low logic level signal. The memory controller 14 is responsible for issuing commands and data, via the channel 18, to a selected memory device based on the operation of the host system 12. Data read from the memory devices is transferred via the channel 18 back to the memory controller 14 and host system 12. Operation of flash memory system 10 is synchronized to a clock CLK, which is provided in parallel to each memory device 16. Flash memory system 10 is generally referred to as a multi-drop configuration, in which the memory devices 16 are connected in parallel with respect to channel 18.

In Flash memory system 10, non-volatile memory devices 16 can be identical to each other, and are typically implemented as, for example, AND flash memory devices or another type of flash memory devices. Those skilled in the art will understand that flash memory is organized into banks, and each bank is organized into planes and each plane includes blocks to facilitate block erasure. Most commercially available NAND flash memory devices are configured to have two planes of memory.

There are specific issues that will adversely impact performance of the system. The configuration of Flash memory system 10 imposes physical performance limitations. With the large number of parallel signals extending across the system, the signal integrity of the signals they carry will be degraded by crosstalk, signal skew, and simultaneous switching noise (SSN). Power consumption in such a configuration becomes an issue as each signal track between the flash controller and flash memory devices is frequently charged and discharged for signaling. With increasing system clock frequencies, the power consumption will increase.

There is also a practical limit to the number of memory devices which can be connected in parallel to the channel since the drive capability of a single memory device is small relative to the loading of the long signal tracks. Furthermore, as the number of memory devices increase, more chip enable signals (CE#) are required, and the clock signal CLK will need to be routed to the additional memory devices. Clock performance issues due to extensive clock distribution are well known in the art, which would need to be addressed. Therefore, in order to accommodate a memory system having a large number of memory devices, either a controller having more channels must be used, or and/or the system will need to be clocked at a lower frequency. A controller configured to have multiple channels and additional chip enable signals increases the cost of the memory system. Otherwise, the memory system is limited to a small number of memory devices.

NAND flash memory devices, which is most commonly used for non-volatile data storage applications, may eventually reach a maximum density per chip. Therefore, the multi-drop configured flash memory system of FIG. 1 can be limited in its maximum storage density since the channel 18 can only accommodate a limited number of memory devices.

For example, the channel 18 can be limited to receiving a maximum of 8 memory devices, otherwise loading effects through the addition of further memory devices can negatively impact the overall performance of the memory system 10. Therefore, the only way to increase the total memory capacity of memory system 10 would be to add more channels to memory controller 14. At the current time, memory controllers having up to 8 channels can be used for SSD applications. Accordingly, if each memory device can store 64 Gb of data, then the total memory capacity of a memory system 10 having 8 channels would be 512 GB. It should be noted that each memory device package can include multiple memory device dies, were the data signal lines of the dies are connected to each other in parallel to the pins of the package.

Figure 2:
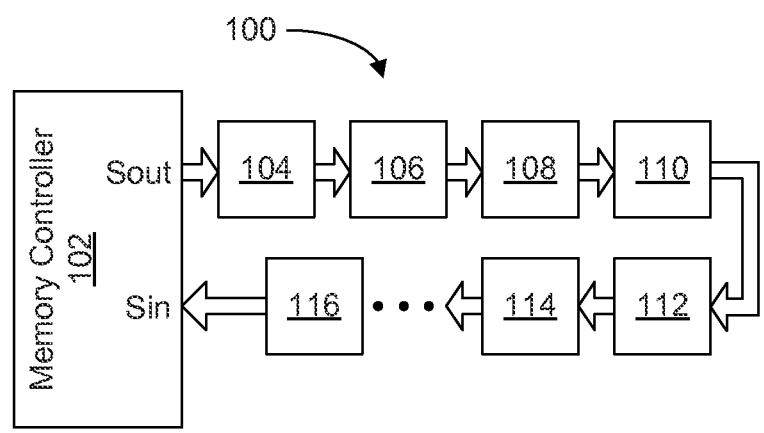
FIG. 2 is a general block diagram of a serial memory system, according to an embodiment of the present invention.

The limitations of the multi-drop system of FIG. 1 are overcome by using a serial memory system, such as the one shown in FIG. 2.

FIG. 2 is a block diagram illustrating the conceptual nature of a serial memory system architecture, according to one embodiment. In FIG. 2, the serial memory system 100 includes a memory controller 102 having at least one serial channel output port Sout and a serial channel input port Sin, and memory devices 104, 106, 108, 110, 112, 114 and 116 that are connected in series. In one embodiment, the memory devices can be flash memory devices. Alternately, the memory devices can be DRAM, SRAM or any other type of memory device provided it has a serial input/output interface compatible with a specific command structure, for executing commands or passing through commands and data to the next memory device. The memory devices may be the same type memories or mixed types of memories (e.g., NAND flash, NOR flash, DRAM, SRAM) in one system. Further details of such memory device configuration and a specific command structure will be described later.

The current embodiment includes seven memory devices, but alternate embodiments can include as few as one memory device, and up to any number of memory devices. Accordingly, if memory device 104 is the first device of serial memory system 100 as it is connected to Sout, then memory device 116 is the Nth or last device as it is connected to Sin, where N is an integer number greater than zero. Memory devices 106 to 114 are then intervening serially connected memory devices between the first and last memory devices. Each memory device can assume a distinct identification number, or device address (DA) upon power up initialization of the system, so that they are individually addressable. Commonly owned U.S. Patent publication Nos. 2011/0087823, 2007/0233917, 2011/0032932, 2008/0192649, 2008/0215778 and 2008/0140899 describe methods for generating device addresses for serially connected memory devices of a memory system.

Memory devices 104 to 116 are considered serially connected because the data input of one memory device is connected to the data output of a previous memory device, thereby forming a series-connection configuration, with the exception of the first and last memory devices in the chain.

The serial memory system shown in FIG. 2 employs memory devices, such as flash memory devices, having compatible serial input/output interfaces. An example of a flash memory device having a serial input/output interface is described in commonly owned U.S. Pat. No. 7,652,922, issued Jan. 26, 2010, the contents of which are incorporated by reference. In another example, an SIP (system in package) flash memory device having a serial input/output interface as described in commonly owned U.S. Pat. No. 7,957,173, issued Jun. 7, 2011, can be used in the serial memory system shown in FIG. 2, the contents of which are incorporated by reference. A block diagram of an example memory device having a serial input/output interface is shown in FIG. 3.

Figure 3:
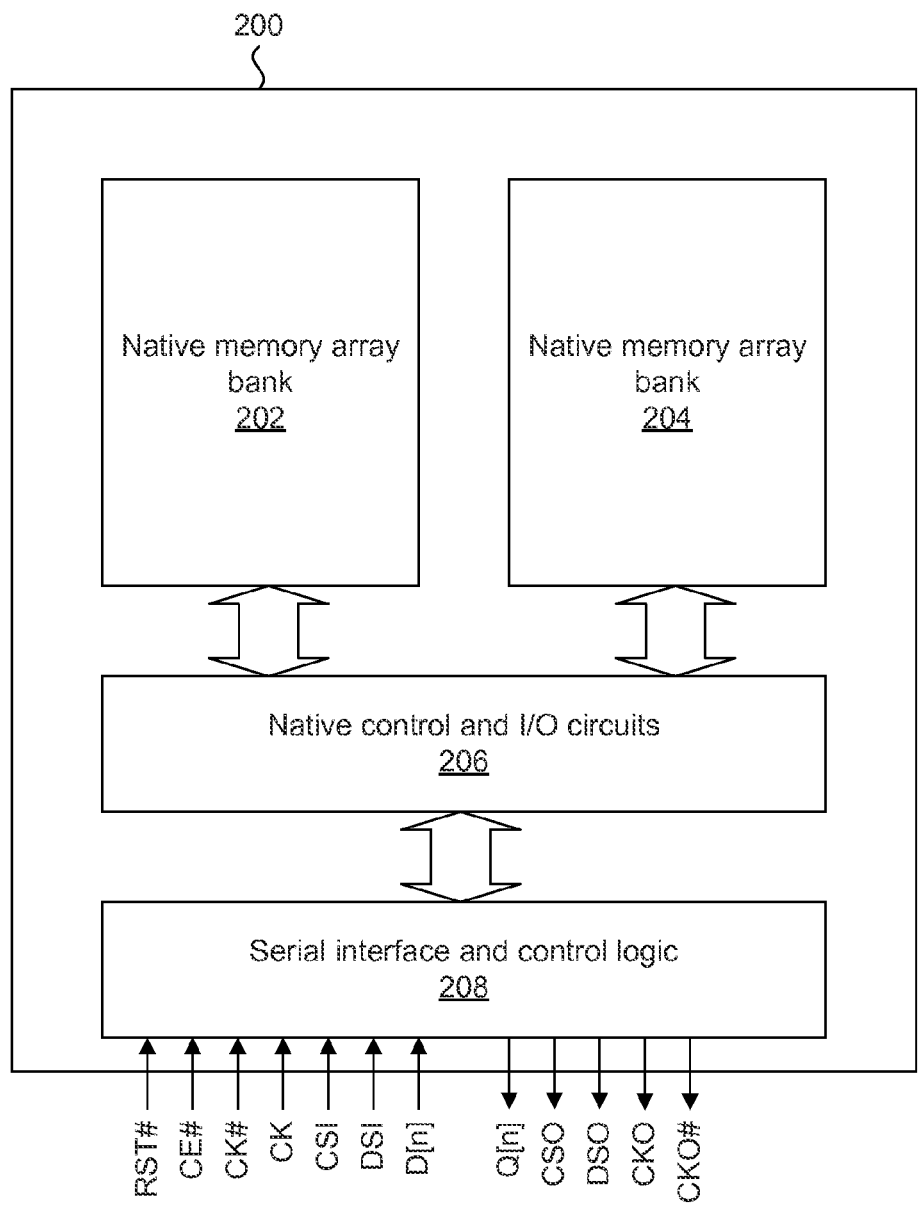
FIG. 3 is a block diagram of a generic memory device having a serial input/output interface, according to an embodiment of the present invention.

FIG. 3 is a block diagram illustrating the organization of a generic memory device having a serial input/output interface suitable for use in the serial memory system of the present embodiments. Memory device 200 includes a native memory core, which includes memory array banks 202 and 204, and control and I/O circuits 206 for accessing the memory array banks 202 and 204. Those skilled in the art will understand that the memory array can be organized as a single memory bank or more than two memory banks. The native memory core can be DRAM, SRAM, NAND flash, or NOR flash memory based for example. Of course, any suitable emerging memory and its corresponding control circuits can be used. Accordingly, depending on the type of native memory core, circuit block 206 can include error correction logic, high voltage generators, refresh logic and any other circuit blocks that are required for executing the operations native to the memory type.

Typically, memory devices use command decoders for initializing the relevant circuits in response to a received command by asserting internal control signals. They will also include well known I/O circuitry for receiving and latching data, commands and addresses. According to the present embodiments, a serial interface and control logic block 208 is responsible for receiving data and control signals, and for outputting or providing, data and control signals. In the present example, the serial interface and control logic block 208 receives RST#, CE#, CK#, CK, CSI, DSI and Dn inputs, and provides Qn, CSO, DSO, CKO and CKO# outputs. Table 1 below summarizes the functions of these signals.

TABLE 1

| Port | Description |
|---|---|
| CK/ CK# | Clock: CK is the system clock input. CK and CK# are differential clock inputs. All commands, addresses, input data and output data are referenced to the crossing edges of CK and CK# in both directions. |
| CE# | Chip Enable: When CE# is LOW, the device is enabled. Once the device starts a Program or Erase operation, the Chip Enable port can be de-asserted. In addition, CE# LOW activates and CE# HIGH deactivates the internal clock signals. |
| RST# | Chip Reset: RST# provides a reset for the device. When RST# is HIGH, the device is on the normal operating mode. When RST# is LOW, the device will enter the Reset mode. |
| D[n] | Data Input: (n = 1, 2, 3, 4, 5, 6, 7 or 8) receives command, address and input data. |
| Q[n] | Data Output: (n = 1, 2, 3, 4, 5, 6, 7 or 8) transmits output data during read operation. |
| CSI | Command Strobe Input: When CSI is HIGH, command, address and input data through D[n] are latched on the crossing of CK and CK#. When CSI is LOW, the device ignores input signals from D[n]. |
| CSO | Command Strobe Output: The echo signal CSO is a re-transmitted version of the source signal CSI. |
| DSI | Data Strobe Input: Enables the Q[n] buffer when HIGH. When DSI is LOW, the Q[n] buffer holds the previous data accessed. |
| DSO | Data Strobe Output: The echo signal DSO is a re-transmitted version of the source signal DSI. |
| CKO/ CKO# | Clock output: the echo clocks CKO/CKO# are re-transmitted version of the received clocks CK/CK#. |

The serial interface and control logic block 208 is responsible for various functions, as discussed in U.S. Pat. No. 7,652,922 by example. Example functions of serial interface and control logic block 208 include setting a device identifier number, passing data through to the next serially connected memory device, and decoding a received command for executing native operations. This circuit will be configured to receive commands serially, and will be configured to include additional commands specific to serial operation of the memory device, in addition to existing native commands specific for controlling core circuits. The command set can be expanded to execute features usable by the memory controller when the memory devices are serially connected. For example, status register information can be requested to assess the status of the memory device.

Accordingly, the memory devices shown in the embodiment of FIG. 2 can employ the flash memory devices disclosed in these previously mentioned patents and patent applications. The serial input/output interface described in these patent applications are examples of a serial interface format that can be used. Any serial input/output interface facilitating serial operation between memory devices can be used, provided it is configured for accepting a predefined command structure.

The channel of memory controller 102 includes a data channel of any data width to carry command, data and address information, and a control channel to carry control signal data. The embodiment of FIG. 2 includes one channel, where one channel includes Sout and corresponding Sin ports. However, memory controller 102 can include any number of channels for accommodating separate memory device chains. By example, a channel can include the CK/CK#, CSI, DSI and Dn signals.

In operation of the particular example as shown in the figures, the memory controller 102 issues a command through its Sout port, which includes an operational code (op code), a device address, address information for reading or programming, and data for programming. The command is issued as a serial bitstream packet, where the packet can be logically subdivided into predefined size segments, such as a byte for example. A bitstream is a sequence or series of bits provided over time. The command is received by the first memory device 104, which compares the device address to its assigned address. If the addresses match, then memory device 104 executes the command. Otherwise, the command is passed through its own output port to the next memory device 106, where the same procedure is repeated. Eventually, the memory device having the matching device address, referred to as a selected memory device, will execute the operation dictated by the command. If the command is to read data, the selected memory device will output the read data through its output port, which is serially passed through intervening memory devices until it reaches the Sin port of the memory controller 102. The memory controller 102 has a serial interface compatible with the serial interface of the memory devices 104 to 116. Examples of command structure and operations of the memory controller and memory devices are described in, for example, US 2007/0109833 A1, May 17, 2007, the contents of which are incorporated by reference.

Figure 4:
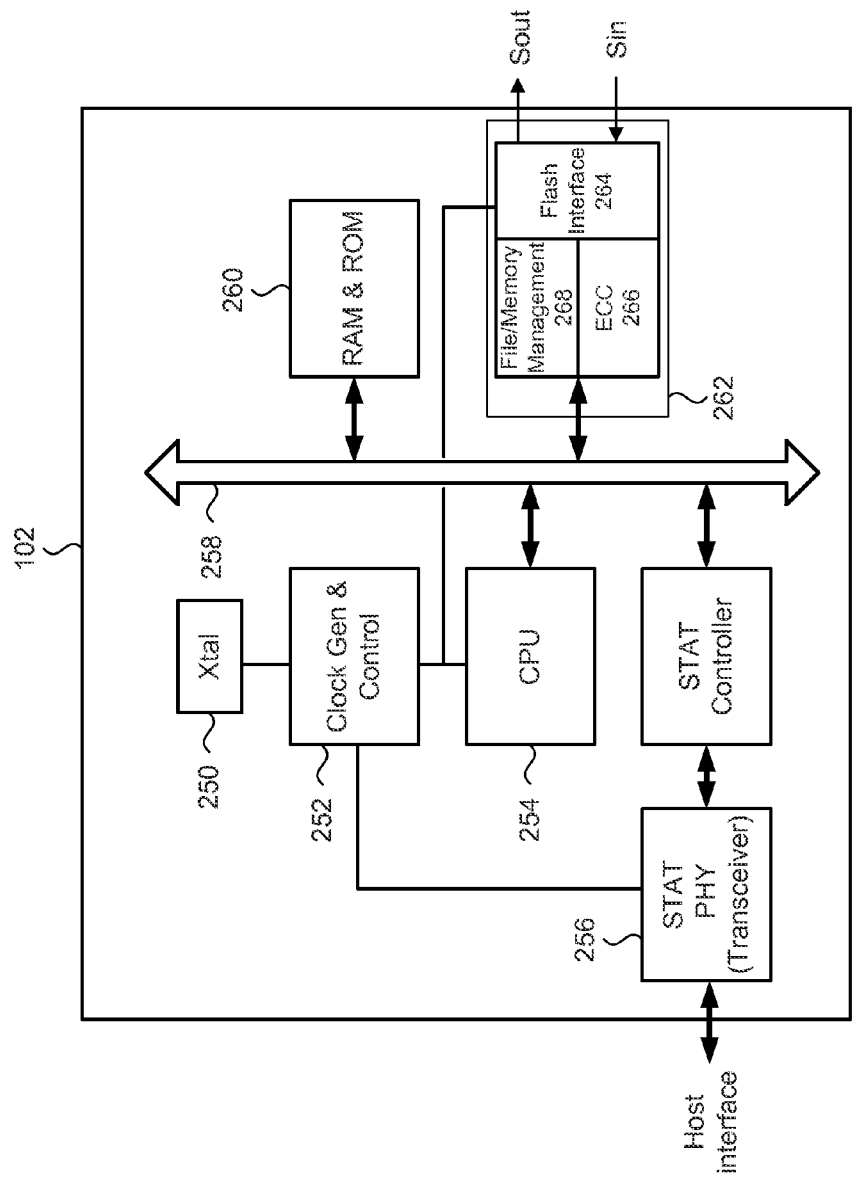
FIG. 4 is a block diagram of a solid state drive (SSD) controller.

FIG. 4 is a block diagram of a solid state drive (SSD) memory controller 102 connected to flash devices which can be used in the memory system 100 of FIG. 2. Operation of the memory controller is described in, for example, US 2007/0165457 A1, Jul. 19, 2007, the contents of which are incorporated by reference. Referring to FIG. 4, a crystal (Xtal) 250 provides a base clock signal which is connected to clock generator & control block 252. The Clock generator & control block 252 provides various clock signals to the central processing unit (CPU) 254, Flash controller and physical layer transceiver (Serial ATA PHY in this example) 256 for the Host Interface. The Host Interface is adapted for communication with an external host system, and can be configured as a serial ATA (SATA), eSTAT, ATA, CE-ATA, PCIe or a universal serial bus (USB) interface by example. Custom interfaces or newly standardized interfaces can also be used. The CPU 254 communicates with other subsystems through a common bus 258. On chip random access memory (RAM) is used as buffer memory and read-only memory (ROM) stores executable codes. Both the RAM and ROM are shown in block 260. The flash control block 262 consists of a physical flash serial interface 264 for enabling communications with a memory device, an error correction (ECC) block 266 and a file & memory management block 268. In operation, flash memory devices are accessed through the physical flash serial interface 264, and accessed data from the flash devices are checked and corrected by the ECC block 266. The file & memory management block 268 provides logical-to physical address translation, and wear-leveling algorithms. With the exception of the flash serial interface 264, all the other components of the memory controller 102 are found in presently available memory controllers for the parallel memory system. Therefore, the parallel memory system memory controller design can be easily adapted for use in the serial memory system architecture embodiments simply by replacing the parallel interface with the flash serial interface 264 compatible for communicating with the memory devices of FIG. 2.

SSD controllers can be formed as an application-specific integrated circuit (ASIC) or field programmable gate array (FPGA) chips. According to the present embodiments, the SSD controller can be configured to have any number of channels, where each channel forms a closed loop signal path from an Sout port of the channel and an Sin port of the channel. Each Sout port provides a set of signals, including but not limited to data signals, clock signals and other control signals. Each Sin port receives this set of signals. As will be discussed later, memory devices connected to at least one memory module are positioned in line with this signal path, and more specifically connected in series with each other.

The previously shown block diagram of the serial memory device of FIG. 3 is formed as a semiconductor chip, and encapsulated in a package with package leads for connection to a printed circuit board. In order to maximize the total memory capacity of a memory device package, multiple semiconductor memory device chips can be packaged together. Within the package, these multiple memory device chips are serially connected with each other such that a first device has its Sin port terminals connected to the Sin port package leads, a last device has its Sout port terminals connected to the Sout package leads, and intervening memory device chips each have its Sin port terminals connected to the Sout port terminals of another memory device chip and its Sout port terminals connected to the Sin port terminals of another memory device chip. This is referred to as a multichip package (MCP).

Figure 5:
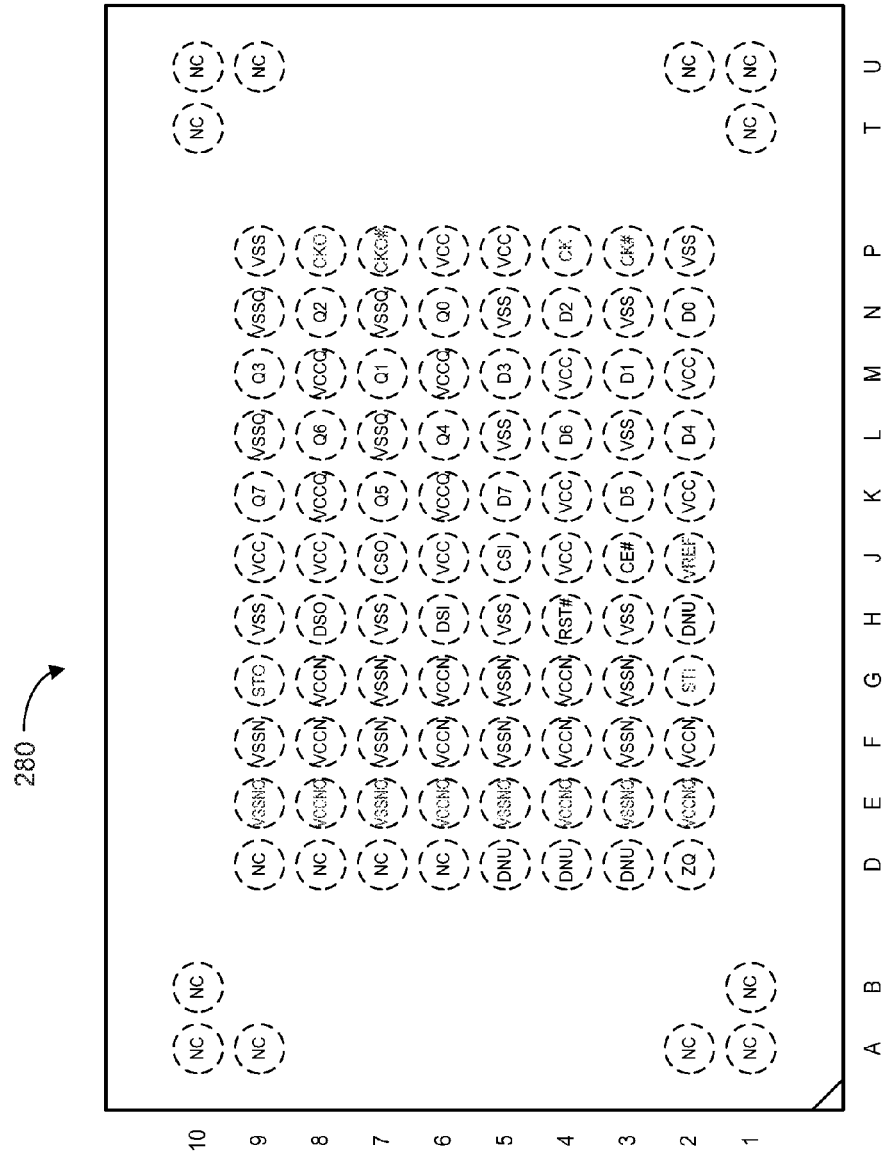
FIG. 5 is a schematic showing a ball grid array layout of a flash memory device package.

FIG. 5 is a diagram of a serial memory device package 280 containing at least one semiconductor serial memory device chip. More specifically, FIG. 5 is a top down view of a package 280 which encapsulates at least one serial memory device having a serial input/output interface, such as the serial input/output interface shown in FIG. 3. The dashed circles represent the positions of ball type connectors on the bottom side of the package, which are connected within the package to pads of the flash memory chip. FIG. 5 is one example of a ball grid array layout, and any alternate layout can be used. It is noted in this example that the package is rectangular in shape, having a long edge and a short edge. In the presently shown example embodiment of FIG. 5, each ball type connector is labeled with a signal name corresponding to the signal names shown in Table 1. In the present embodiments, the package leads of FIG. 5 are electrically connected to complementary connections on a PCB.

According to the present embodiments, multiple packages are connected to a memory blade, and interconnected with each other in a serial configuration. In the present embodiments, a memory blade is a PCB having memory devices mounted thereon without a memory controller.

Figure 6:
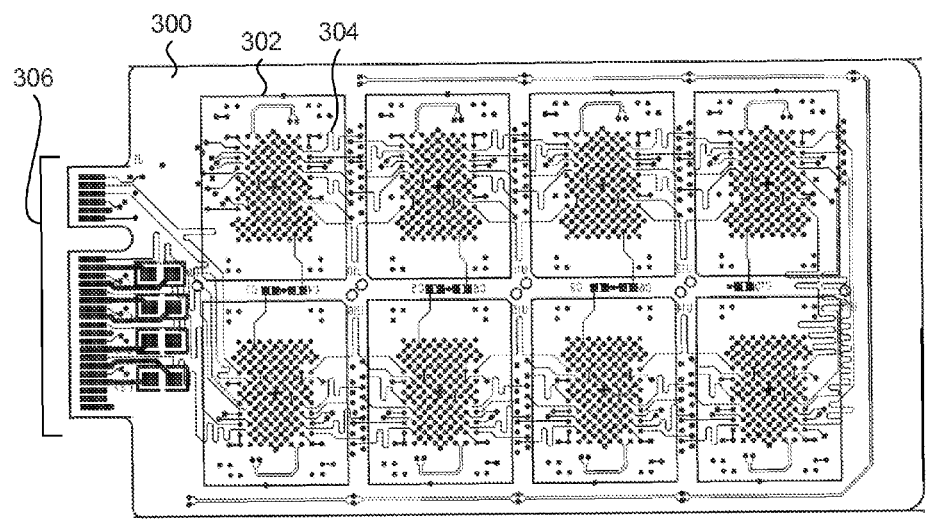
FIG. 6 is a diagram showing an example printed circuit board of a fat type memory blade, according to an embodiment of the present invention.
Figure 7:
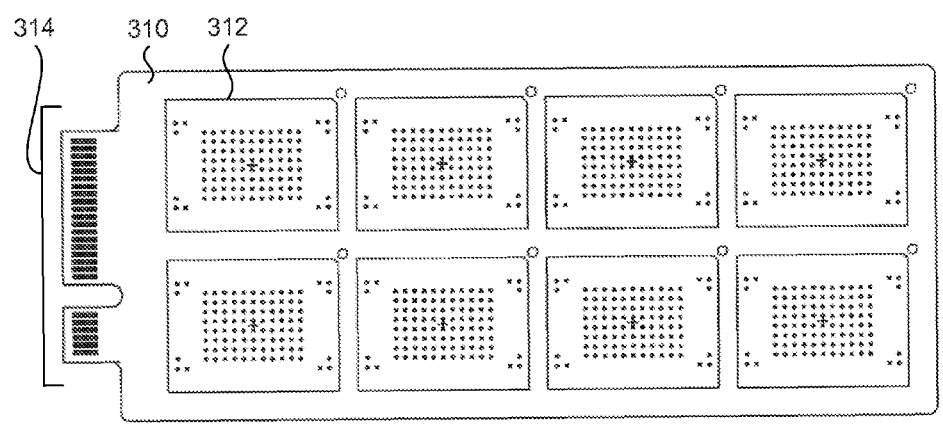
FIG. 7 is a diagram showing an example printed circuit board of a skinny type memory blade, according to an embodiment of the present invention.

FIG. 6 and FIG. 7 are diagrams of differently shaped memory blades without mounted memory devices, according to the present embodiments. FIG. 6 shows a fat type memory blade 300 which is shaped to receive eight flash memory device packages of the type shown in FIG. 5 on one side thereof. Eight more flash memory device packages can be attached to the other side of the fat type memory blade. The outline box 302 indicates the position where one memory device package is to be mounted to the PCB, which has the complementary connections to the ball connectors on the underside of the memory device package. The diagram of FIG. 6 shows the package ball signal diagram where connections between the ball connectors of the memory devices are electrically connected to traces of the PCB. The substrate of the fat type memory blade is a PCB having metal line traces for interconnecting the flash memory device packages serially with each other. According to the present embodiment, the signal traces are configured to connect each flash memory device serially with the other. An example line trace is line 304. It should be noted that the PCB can include several layers of line traces, thus not all signal connections are shown on the top layer of FIG. 6.

A connection interface, such as male type connector tab 306, extends from the left side of the fat type memory blade, and includes a set of conductor leads for receiving the input (Sin) and for providing the output (Sout) of the channel it is connected to. Both sides of the connector tab can include a set of conductor leads, where one can be the input set of conductor leads and the other can be the output set of conductor leads. The connector tab 306 is removably insertable into a complementary socket (not shown) of a memory blade connector. As can be seen in FIG. 6, the dimensions of the memory blade are determined by the orientation of the flash memory device package, in which the long edges are parallel to the vertical edges of the memory blade.

The memory blade embodiment of FIG. 7, referred to as a skinny type memory blade 310, is also shaped to receive eight flash memory device packages on one side thereof, and another eight flash memory device packages on the opposite side thereof. An outline box 312 shows the position where one memory device package is to be mounted to the PCB, but conductive line traces are not shown. A connection interface, such as connector tab 314, extends from the left side of the skinny type memory blade, and includes a set of conductor leads for continuing either the input or the output of the channel it is connected to. Both sides of the connector tab can include a set of conductor leads, where one can be the input set of conductor leads and the other can be the output set of conductor leads. Alternate conductor lead signal assignments are possible. The skinny type memory blade is functionally identical to the fat type memory blade of FIG. 6, except that the form factor differs. More specifically, the short edges of the flash memory device packages are oriented to be parallel to the vertical edges of the memory blade.

Figure 8:
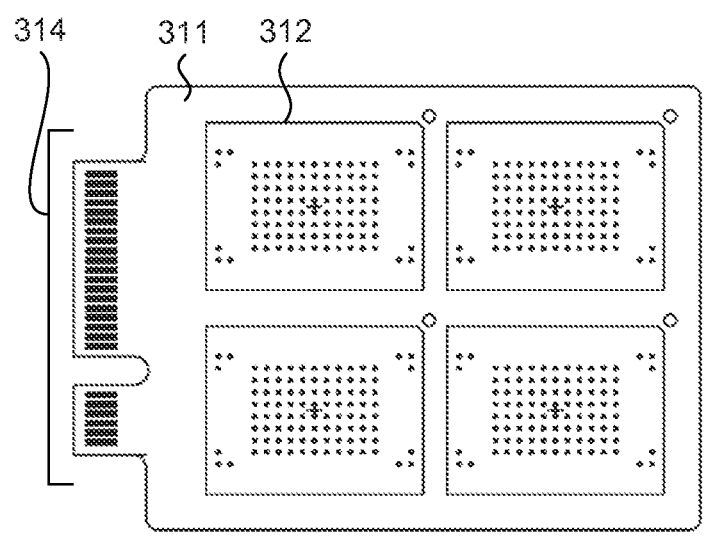
FIG. 8 is a diagram showing an example printed circuit board of an alternate skinny type memory blade, according to an embodiment of the present invention.

It is noted at this time that the memory blades of FIGS. 6 and 7 are not limited to have eight memory devices mounted to each side thereof. The memory blade PCB can be sized and shaped to accommodate any number of memory devices, in any layout configuration. For example, the memory blade 311 of FIG. 8 is a shortened version of the skinny type memory blade 310 shown in FIG. 7, sized and shaped in the length and width dimensions to accommodate four memory devices 312 on each side.

Figure 9:
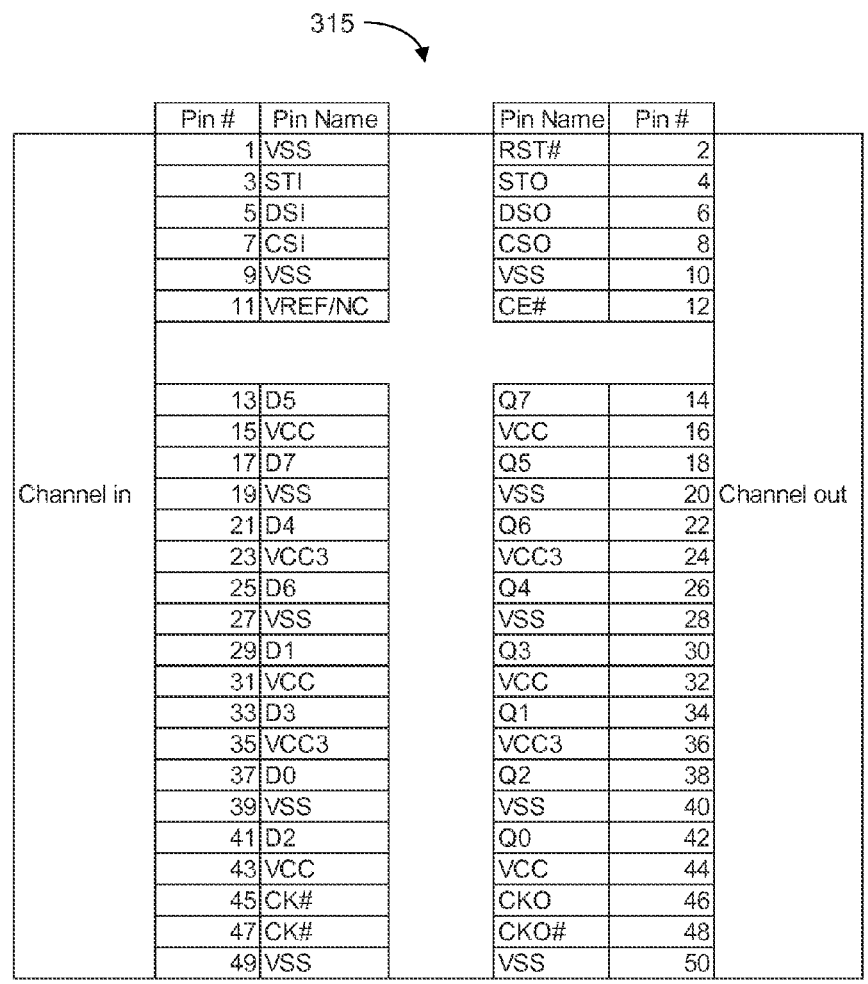
FIG. 9 is an example pin assignment for connectors of the memory blades of FIGS. 6, 7 and 8, according to an embodiment of the present invention.

The connector tabs 306 and 314 can be shaped the same, and have the same pin or lead configurations for carrying signals provided to and received from the mounted memory device packages. FIG. 9 is a table 315 listing the pin assignments of the connector tab for either the fat type memory blade or the skinny type memory blades shown in FIGS. 6, 7 and 8. All the input signals and output signals shown in FIG. 9 are part of a single serial channel. In this example, the pins appearing on the left side of the table are part of the channel input for receiving signals while the pins appearing on the right side of the table are part of the channel output for providing or outputting signals. In this particular example, all the channel input pins are formed on one side of the connector tab, while all the channel output pins are formed on the other side of the connector tab. Alternately, the channel input and output pins can be mixed on either side of the connector tab, or formed only on one side of the connector tab.

It can be seen that the memory packages, once mounted to the memory blades of either FIG. 6 or FIG. 7, are either closely spaced to each other or to the connector tab. An advantage of this configuration is that conductive line traces between adjacent memory packages or between the connector tab and a memory package can be minimized, in order to minimize signal line capacitance between packages. For example, a first memory package has its Sin port input terminals connected to the Sin pins of the memory blade, a last memory package has its Sout port output terminals connected to the Sout pins of the memory blade, and intervening memory packages are arranged serially between the first and last memory packages. The directional flow of information through the memory packages is shown in FIG. 10 by example.

It should be noted that the previously shown embodiments of the memory blades do not include a memory controller mounted to it. Accordingly, the memory blade embodiments are memory controller free.

The memory blades of FIGS. 6, 7 and 8 can be single channel or multi-channel memory blades. FIG. 10 is a functional block diagram of a single channel memory blade, having multiple memory packages mounted to a PCB and serially connected with each other between the Sin port terminals and the Sout port terminals of the memory blade.

Figure 10:
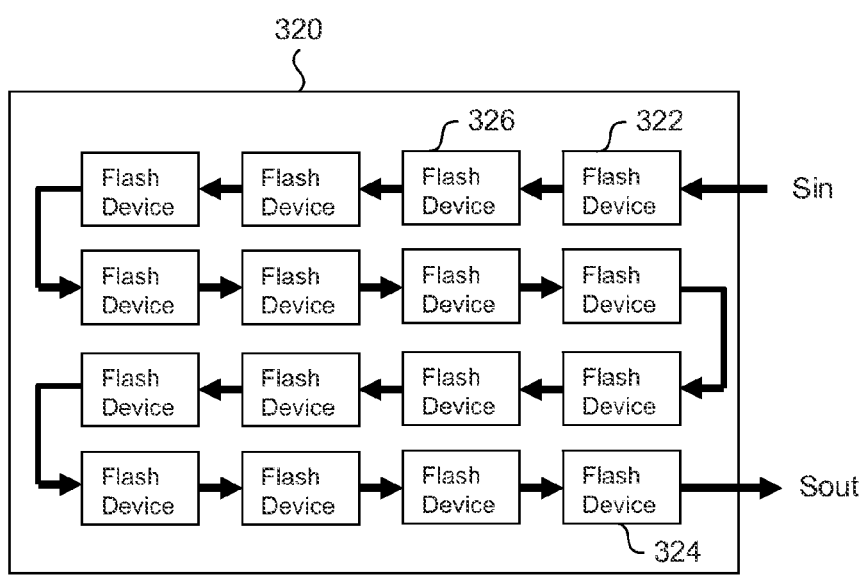
FIG. 10 is a block diagram of a single channel memory blade, according to an embodiment of the present invention.

In FIG. 10, the memory blade PCB 320 includes a first memory package 322, a last memory package 324, and intermediate memory packages 326. The first memory package 322 has its Sin port input terminals connected to the Sin input terminals of the memory blade, labeled in FIG. 10 as "Sin". The last memory package 324 has its Sout port output terminals connected to the Sout output terminals of the memory blade, labeled in FIG. 10 as "Sout". Each of the intervening memory packages 326 is connected to two adjacent intervening memory packages 326, or to the first memory package 322 and the last memory package 324. The arrows between each memory package illustrates the direction of command and data flow from the Sin port input terminals to the Sout output terminals of PCB 320. All the memory packages on PCB 320 are part of a single channel.

Figure 11:
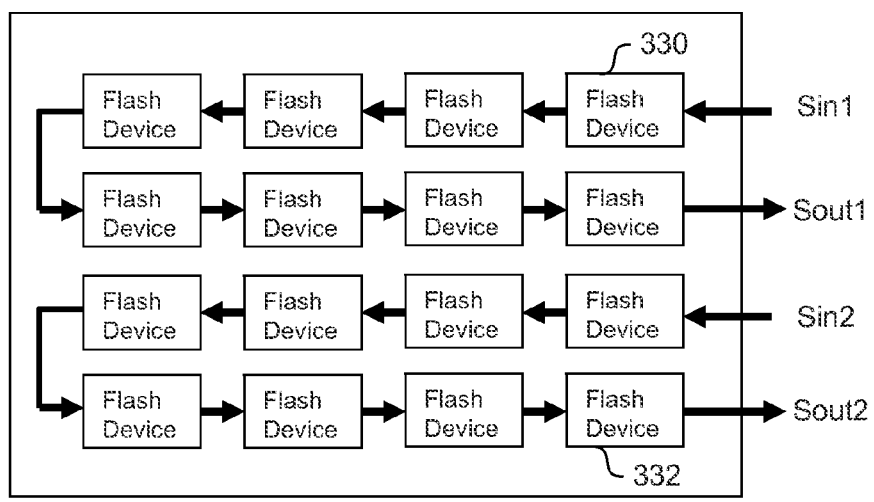
FIG. 11 is a block diagram of a multiple channel memory blade, according to an embodiment of the present invention.

FIG. 11 is a block diagram of a multiple channel memory blade, according to a present embodiment. More specifically, the embodiment of FIG. 11 is a two channel memory blade. As shown in FIG. 11, there are a total of 16 memory packages devices divided into two different groups of memory devices which are serially connected to each other. In the present example, the first group includes eight serially connected memory packages 330 and the second group includes another eight serially connected memory packages 332. The first group of serially connected memory packages 330 are part of one channel, and are serially connected between the input terminals of Sin1 and the output terminals of Sout1. The second group of serially connected memory packages 332 are part of one channel, and are serially connected between the input terminals of Sin2 and the output terminals of Sout2. Although the present example shows memory packages grouped to form two different channels, different configurations can have more than two groups of memory packages each corresponding to a respective channel. For such an embodiment, the physical connector of the memory blade would have the necessary number of pins to accommodate the data and control signals for the multiple channels.

The memory blade embodiments shown in FIG. 10 and FIG. 11 are examples of possible arrangements of memory packages on a PCB that form a particular signal path route between the input terminals and the output terminals of one or more channels. Any arrangement of the memory packages on the PCB is possible. As previously mentioned, both sides of the PCB can have memory packages mounted thereon, therefore the signal path route can pass from a memory package on one side of the PCB to a memory package on the opposite side of the PCB. All the memory blades shown in the previous embodiments can be inserted into a complementary shaped socket for a corresponding channel or channels via their connector tabs. Further details of such sockets are described later.

Following are block diagrams showing different SSD memory system configurations, according to the present embodiments.

Figure 12:
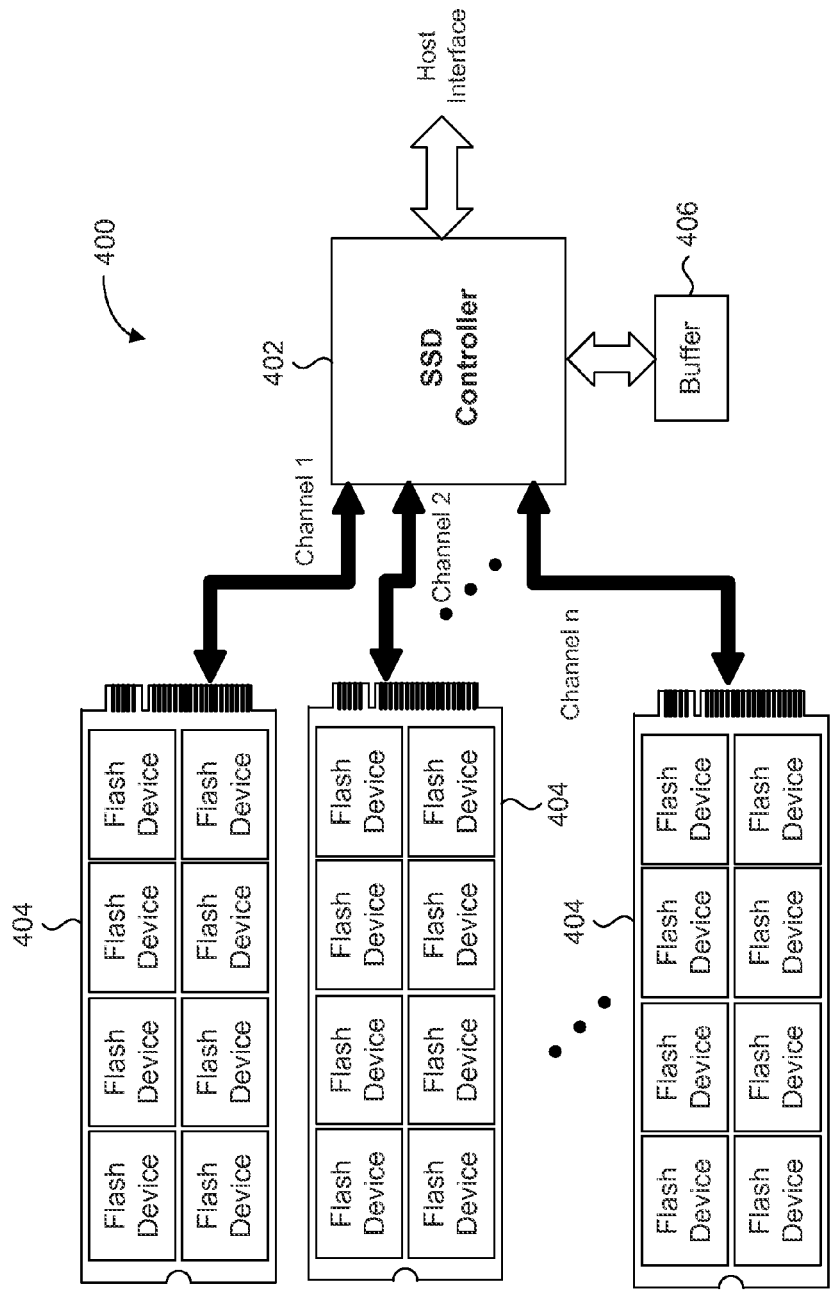
FIG. 12 is a block diagram of an SSD memory system having a single memory blade per channel, according to an embodiment of the present invention.

FIG. 12 is a block diagram of an SSD memory system having a single skinny type memory blade per channel, according to a present embodiment. In particular, the SSD memory system 400 of FIG. 12 has a memory controller 402 configured to have up to n channels, and each channel is connected to a single channel memory blade 404, similar to the memory blade 310 shown in FIG. 7 by example. In the presently shown embodiment, each channel is depicted with a bidirectional line, representing the presence of both Sout and Sin lines for the channel. Alternately, memory blades having any shape can be used for accommodating specific area or form factor limitations, as will be described later. Buffer memory 406, such as SDRAM memory for example, is connected to the memory controller 402 for temporary storage of data to or from the memory blades 404 of any channel. The memory controller 402 can include any type of host interface, such as but not limited to, PCIe, SATA, USB or Thunderbolt interfaces, for communicating data to or from the host device.

Figure 13:
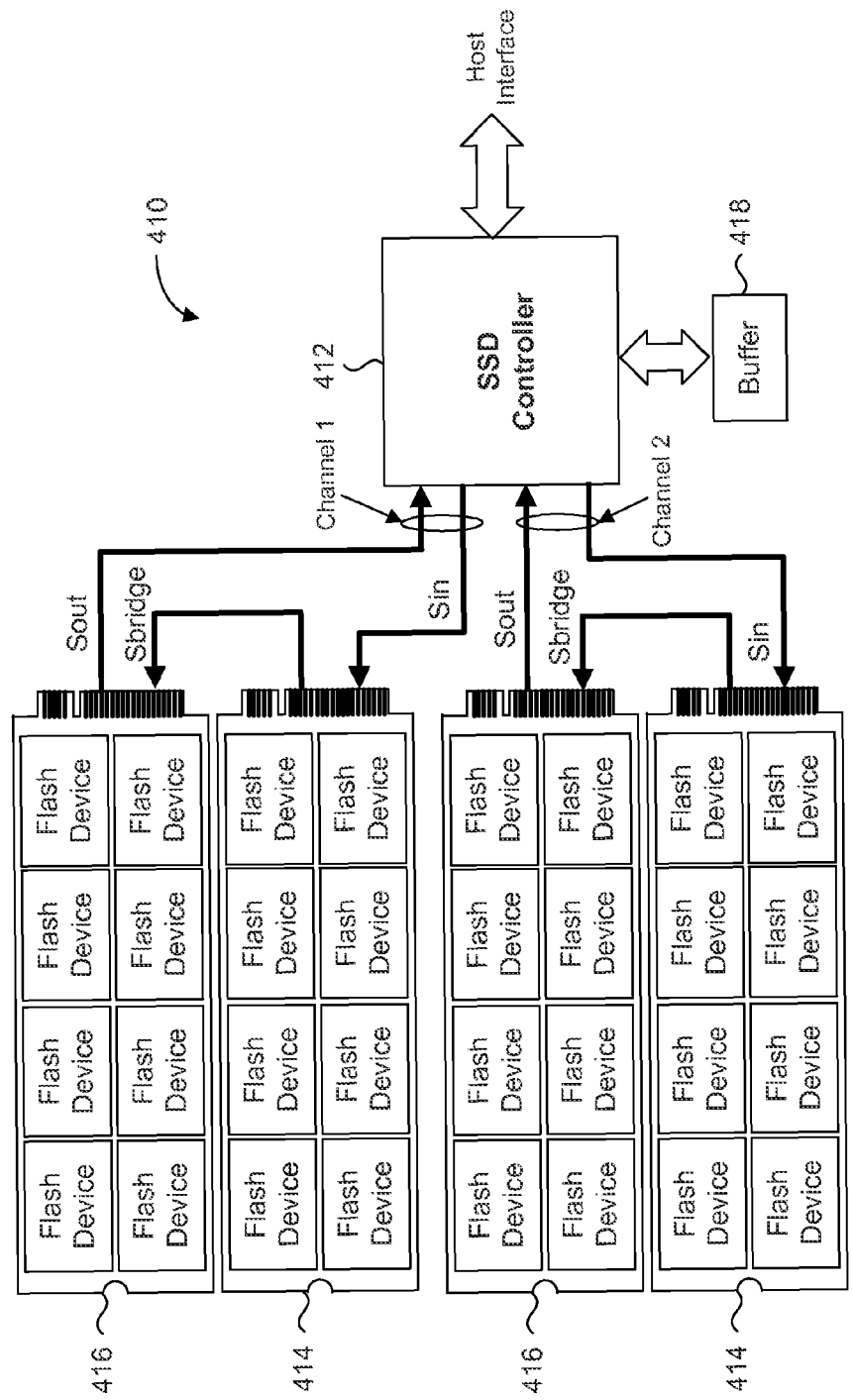
FIG. 13 is a block diagram of an SSD memory system having multiple memory blades per channel, according to an embodiment of the present invention.

FIG. 13 is a block diagram of an SSD memory system having multiple skinny type memory blades per channel, according to a present embodiment. In particular, the SSD memory system 410 of FIG. 13 has a memory controller 412 configured to have a number of channels, two of which are shown in the present example, where the memory controller 412 can be the same as memory controller 402 used in the embodiment of FIG. 12. In this alternate embodiment each channel is connected to a pair of single channel memory blades 414 and 416, where each memory blade is similar to the memory blade 310 shown in FIG. 8 by example. Buffer memory 418, such as SDRAM memory for example, is connected to the memory controller 412 for temporary storage of data to or from the memory blades 414 and 416 of any channel. The memory controller 412 can include any type of host interface, such as but not limited to, PCIe, SATA, USB or Thunderbolt interfaces, for communicating data to or from the host device.

In the presently shown embodiment, each channel is depicted with three lines. First is an Sin line, second is an Sout line, and third is an Sbridge line. More specifically, the Sin line is connected to the Sin input terminals of memory blade 414 while the Sout line is connected to the Sout output terminals of memory blade 416. Therefore the Sin line carries all the signals of the Sin input terminals while the Sout line carries all the signals of the Sout output terminals. The Sbridge line connects the Sout output terminals of memory blade 414 to the Sin input terminals of memory blade 416, thereby continuing the channel and data path route from memory blade 414 to 416. Accordingly, the pair of memory blades 414 and 416 are serially connected with each other. Functionally, the two serially connected single channel memory blades 414 and 416 form the equivalent of a single memory blade having the aggregate number of memory devices of both memory blades connected serially together. However it should be noted that any number of memory blades can be serially connected with each other for each channel, simply by bridging the Sout output terminals of one memory blade to the Sin input terminals of another memory blade.

Figure 14:
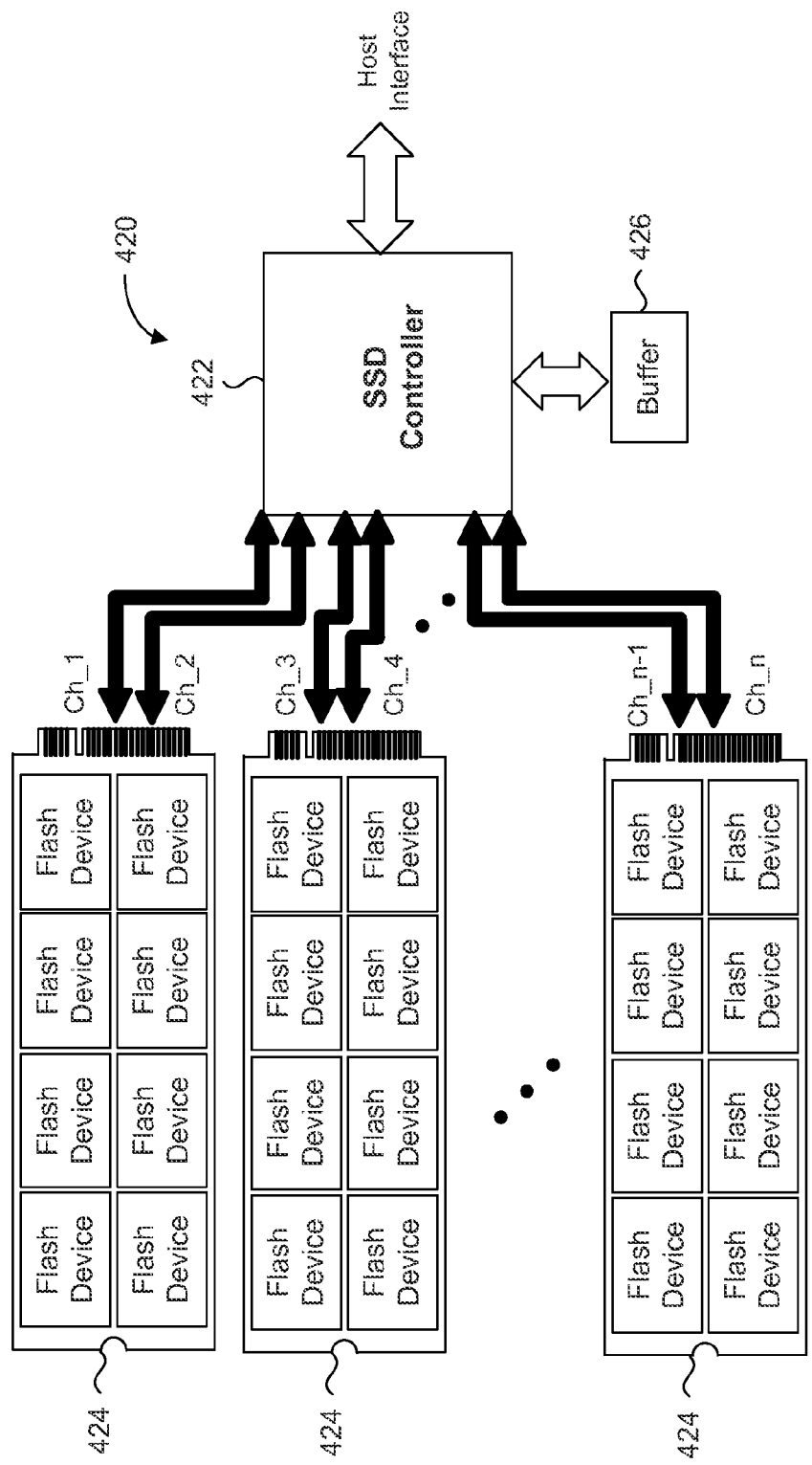
FIG. 14 is a block diagram of an SSD memory system having memory blades with multiple channels, according to an embodiment of the present invention.

FIG. 14 is a block diagram of an SSD memory system having skinny type memory blades with multiple channels, according to a present embodiment. In particular, the SSD memory system 420 of FIG. 14 has a memory controller 422 configured to have up to n channels, and can be the same memory controller used in the embodiments of FIG. 12 and FIG. 13. In this alternate embodiment, 2 channels are connected to each dual channel memory blade 424. Each dual channel memory blade can have the configuration shown in FIG. 11 by example. Buffer memory 426, such as SDRAM memory for example, is connected to the memory controller 422 for temporary storage of data to or from the memory blades 424 of any channel. The memory controller 422 can include any type of host interface, such as but not limited to, PCIe, SATA, USB or Thunderbolt interfaces, for communicating data to or from the host device. In the presently shown embodiment, first to fourth channels are annotated as "Ch_1", "Ch_2", "Ch_3" and "Ch_4". The last channel is annotated as "Ch_n" and the second last channel is annotated as "Ch_n–1". Each of these channels is depicted with a bidirectional line, representing the presence of both Sout and Sin lines for the channel.

It should be noted that each memory blade can have memory devices arranged to form more than 2 channels, each being connected to a channel of the memory controller 422.

The SSD memory system embodiments of FIGS. 12, 13 and 14 illustrate different possible example configurations of an SSD memory system. In each of these embodiments, the SSD controller is configured to include at least one data channel, where each data channel has Sin lines for carrying input signals to the serially connected memory devices of the respective channel, and Sout lines for carrying output signals from the serially connected memory devices of the same respective channel. While the number of channels configured for the SSD controller may be fixed, different physical configurations of memory blades are possible. This allows for flexible SSD memory system design to meet technical/performance requirements. For example, one memory blade can be connected to each channel to maximize performance by distributing bits of data across all the memory blades so that a large amount of data can be written or read concurrently in a single memory write or read cycle. Alternately, physical form factor requirements may limit the number of memory blades which can be connected. On the other hand, the lack of such physical requirements may allow for any number of memory blades to be serially connected to each channel for large mass storage applications. The SSD memory system of the present embodiments is easily configurable to accommodate performance and/or physical requirements without any significant system design overhead. Following is a description of possible physical configuration embodiments of the previously described SSD memory system embodiments.

As previously discussed, the memory blades can be double-sided, meaning that that PCB has memory devices mounted to either side of the PCB, with preset traces formed therein for serially interconnecting the memory devices together. Many possible interconnection configurations are possible. Example serial interconnection configurations of memory devices on a double-sided memory blade are shown in the embodiments of FIGS. 15, 16 and 17.

Figure 15:
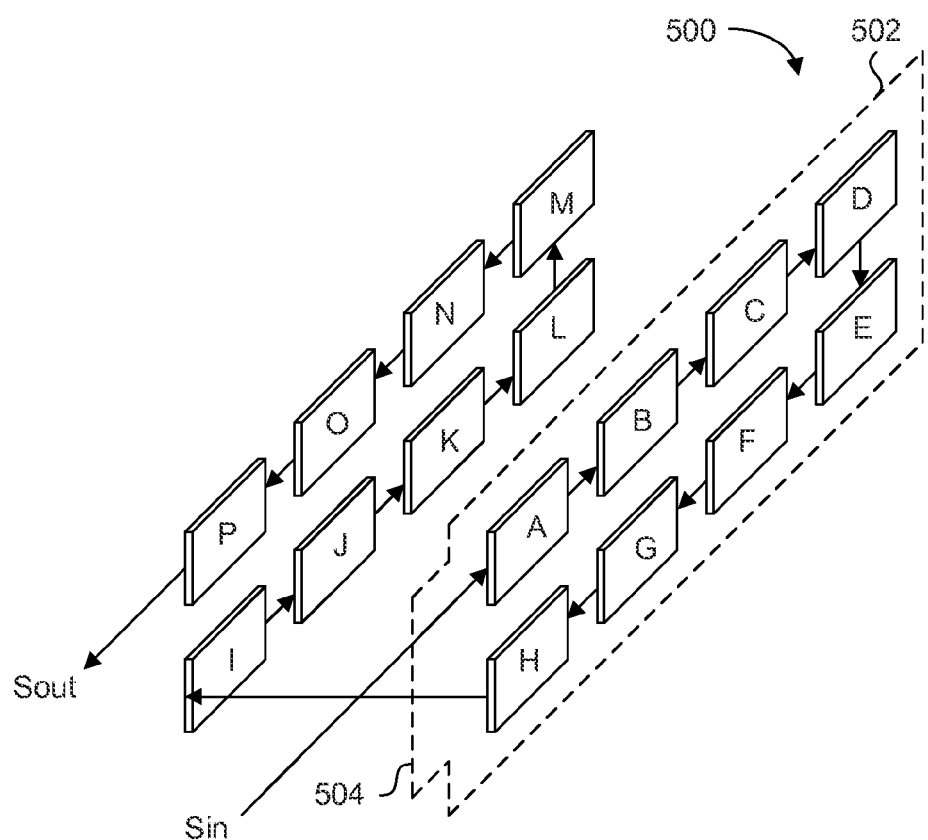
FIG. 15 is an illustration showing an interconnection of serial memory devices of a memory blade, according to an embodiment of the present invention.

FIG. 15 is a perspective view of a double-sided memory blade, similar to the one shown in FIG. 8. Memory blade 500 includes eight memory devices labeled "A" through "H" mounted to one side of PCB 502 thereof. Another eight memory devices labeled "I" through "P" are mounted to the other side of PCB 502. The memory devices are arranged in rows and columns in the presently shown example. For the purposes of clarity, the eight memory devices "I" through "P" are shown as being separated from the PCB, but should be treated as being connected to the trace lines of the PCB 502. As shown in FIG. 15, Sin received at connector tab 504 is routed to a first memory device "A". The arrows extending between the memory devices indicates the direction of the serial signal path. In the present embodiment, the signals are first serially propagated through memory devices "A", "B", "C", "D", "E", "F", "G" and "H", and then serially propagated through memory devices "I", "J", "K", "L", "M", "N", "O" and "P" on the other side of PCB 502. The transfer of the serial channel signal from memory device "H" to memory device "I" is achieved by electrically connecting them to each other through the PCB 502. Eventually, the Sout signal is provided by the last memory device "P" via the connector tab 504.

The interconnection configuration of the memory devices is referred to as a backtrack interconnection configuration, as the signal path direction and pattern through memory devices "A" through "H" on one side of the PCB 502 is reversed after it passes to memory device "I" on the opposite side of PCB 502. In other words, on one side of PCB 502, signal propagation starts at the left-most device of the top row (memory device "A"), and ends at the left-most device of the bottom row (memory device "H"). On the opposite side of PCB 502, signal propagation starts at the left-most device of the bottom row (memory device "I"), and ends at the left-most device of the top row (memory device "P").

Figure 16:
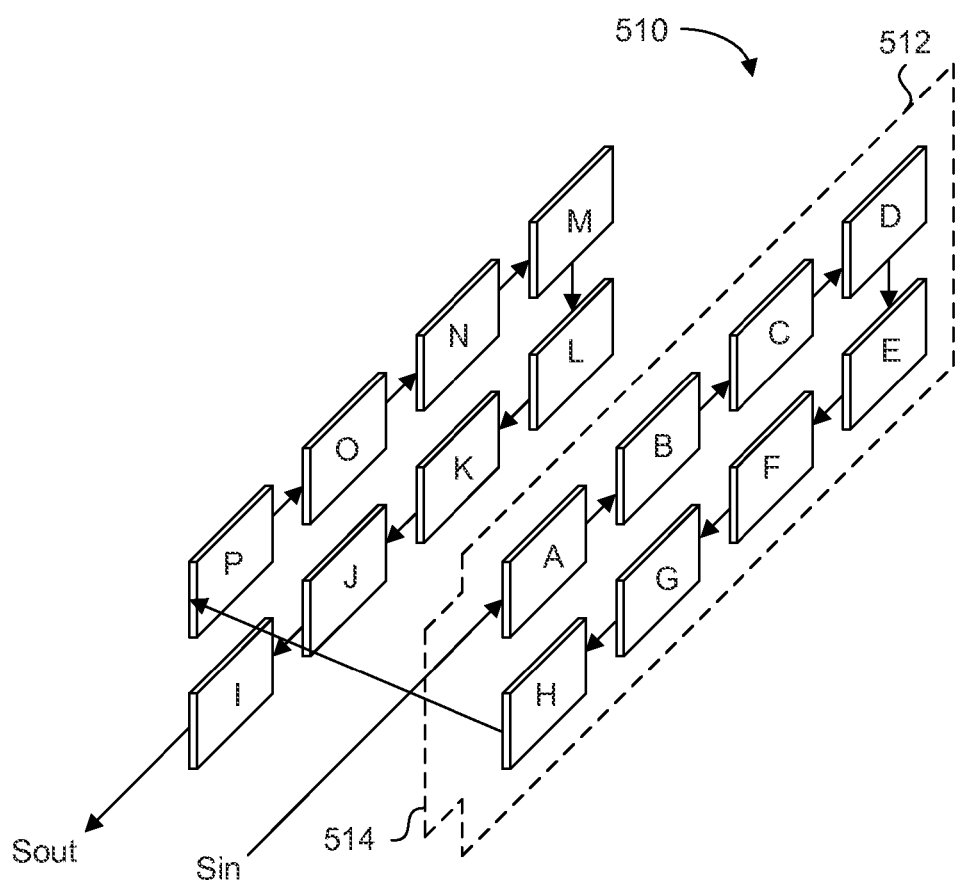
FIG. 16 is an illustration showing an alternate interconnection of serial memory devices of a memory blade, according to an embodiment of the present invention.
Figure 17:
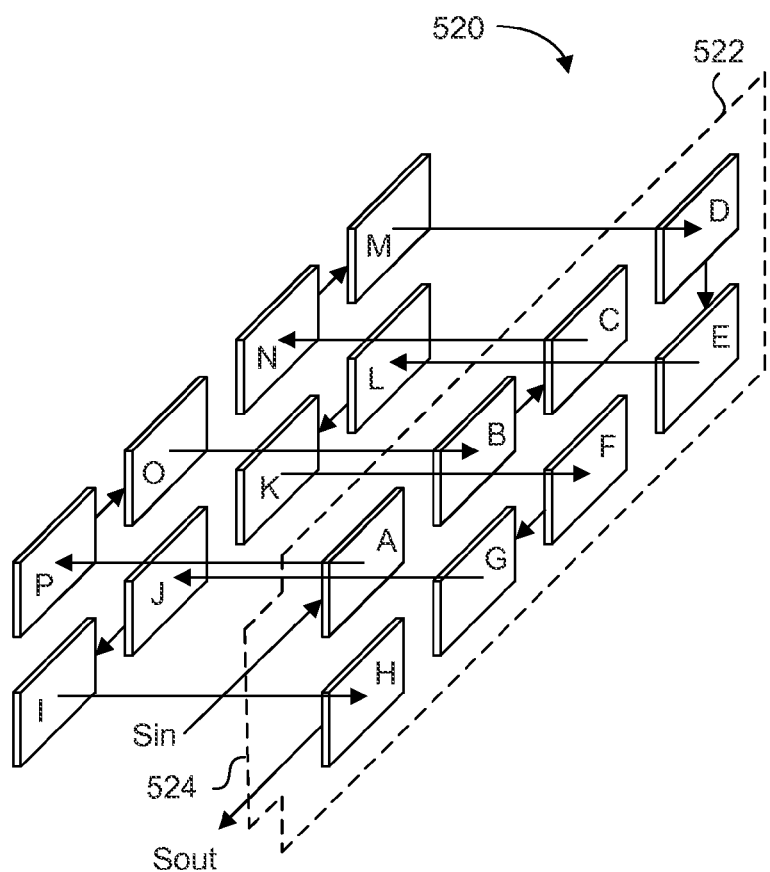
FIG. 17 is an illustration showing an alternate interconnection of serial memory devices of a memory blade, according to an embodiment of the present invention.

FIG. 16 is a perspective view of a double-sided memory blade, similar to the one shown in FIG. 15. Memory blade 510 includes eight memory devices labeled "A" through "H" mounted to one side of PCB 512 thereof. Another eight memory devices labeled "I" through "P" are mounted to the other side of PCB 512. For the purposes of clarity, the eight memory devices "I" through "P" are shown as being separated from the PCB, but should be treated as being connected to the trace lines of the PCB 512. It is noted that the positions of memory devices is the same as the memory devices of FIG. 15. As shown in FIG. 16, Sin received at connector tab 514 is routed to a first memory device "A". The arrows extending between the memory devices indicates the direction of the serial signal path. In the present embodiment, the signals are first serially propagated through memory devices "A", "B", "C", "D", "E", "F", "G" and "H", and then serially propagated through memory devices "P", "O", "N", "M", "L", "K", "J" and "I" on the other side of PCB 512. The transfer of the serial channel signal from memory device "H" to memory device "P" is achieved by electrically connecting them to each other through the PCB 512. Eventually, the Sout signal is provided by the last memory device "I" via the connector tab 514.

This is referred to as a helical interconnection configuration as all the memory devices are serially connected such that the signal propagation path or pattern is repeated on both sides of the PCB 512. In other words, on one side of PCB 512, signal propagation starts at the left-most device of the top row (memory device "A"), and ends at the left-most device of the bottom row (memory device "H"). On the opposite side of PCB 512, signal propagation starts at the left-most device of the top row (memory device "P"), and ends at the left-most device of the bottom row (memory device "I").

FIG. 17 is a perspective view of a double-sided memory blade, similar to the one shown in FIG. 15. Memory blade 520 includes eight memory devices labeled "A" through "H" mounted to one side of PCB 522 thereof. Another eight memory devices labeled "I" through "P" are mounted to the other side of PCB 522. For the purposes of clarity, the eight memory devices "I" through "P" are shown as being separated from the PCB, but should be treated as being connected to the trace lines of the PCB 522. It is noted that the positions of memory devices are the same as the memory devices of FIG. 15. As shown in FIG. 17, Sin received at connector tab 524 is routed to a first memory device "A". The arrows extending between the memory devices indicates the direction of the serial signal path. In the present embodiment, the signal path passes between memory devices mounted to either side of PCB 522. In particular, the signal path is as follows: "A", "P", "O", "B", "C", "N", "M", "D", "E", "L", "K", "F", "G", "J", "I" and "H". Eventually, the Sout signal is provided by the last memory device "H" via the connector tab 524.

This is referred to as a stitching interconnection configuration as all the memory devices are serially connected such that the signal propagation path or pattern repeatedly passes between memory devices on both sides of the PCB 512. In other words, the signal path propagates through all memory devices in the top rows of both sides of the memory blade and then through all memory devices in the bottom rows of both sides of the memory blade.

Alternate interconnection patterns of memory devices on a memory blade are possible, by changing the orientation of the memory devices and/or position of the memory devices on the PCB of the memory blade. Any interconnection configuration is possible provided the memory devices in communication with each other are connected to each other with minimal length signal traces on the PCB. The above described interconnection patterns can be applied to the shortened version of the skinny type memory blade of FIG. 8. Furthermore, any suitable interconnection pattern can be applied to memory blades having memory devices mounted only to one side thereof. The previously described interconnection configurations are examples of a closed loop configuration where the memory devices mounted to the PCB of the memory blade form a closed loop with the connector tab, and more specifically, with the Sin and Sout ports of the connector tab.

Figure 18:
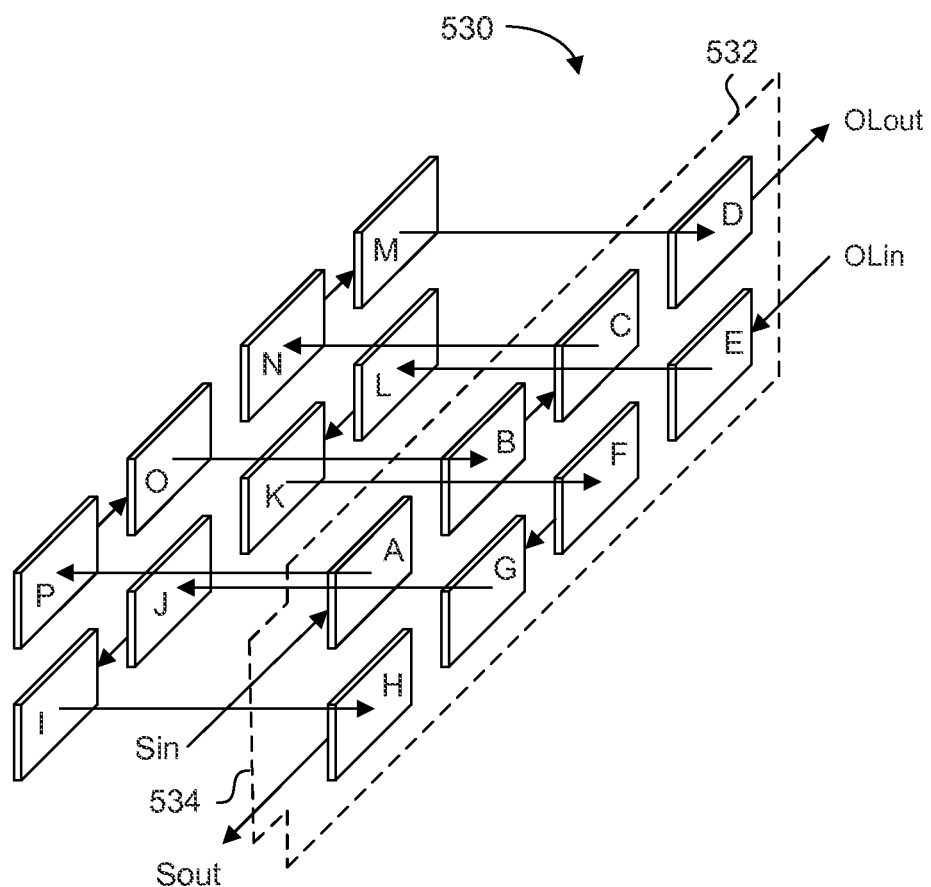
FIG. 18 is an illustration showing an open loop interconnection of serial connected memory devices of a memory blade, according to an embodiment of the present invention.

According to an alternate embodiment, the memory blades can have an open loop configuration. FIG. 18 is a perspective view of a double-sided memory blade, similar to the one shown in FIG. 17 and having the same memory device interconnection configuration.

Memory blade 530 includes eight memory devices labeled "A" through "H" mounted to one side of PCB 532 thereof, also referred to as a set of serially connected memory devices. Another eight memory devices labeled "I" through "P" are mounted to the other side of PCB 532, also referred to as a set of serially connected memory devices. Memory blade 530 has an additional open loop output port OLout and open loop input port OLin, where OLout is connected to the output of memory device "D" and OLin is connected to the input of memory device "D". These ports are formed as signal line traces that terminate with conductive terminals near the edge of the PCB. Therefore, Sin received at connector tab 534 propagates through memory devices "A", "P", "O", "B", "C", "N", "M", "D" and finally through OLout. The received signal from OLin propagates through memory devices "E", "L", "K", "F", "G", "J", "I", "H" and finally through Sout of connector tab 534. Therefore, OLout carries the same types of signals as Sin while OLin carries the same types of signals as Sout. In the present embodiments, the signals carried by Sin, Sout, OLin and OLout ports include the clock signals, the command strobe, data strobe and data signals.

As will be described in further detail, the previously described memory blade embodiments can be used for construction of an expandable memory module. More specifically, the previously described memory blades can be configured as modular components for construction or assembly of an expandable memory module having any storage capacity. If each modular memory blade has a local storage capacity, then the expandable memory module will have an overall storage capacity equivalent to an aggregate sum of the local storage capacities of the constituent memory blades.

Figure 19:
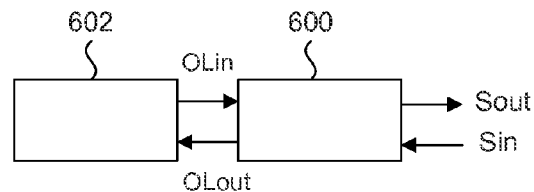
FIG. 19 is a block diagram of a multi-blade memory module, according to an embodiment of the present invention.

FIG. 19 is a block diagram illustrating the concept of the expandable memory module system, according to a present embodiment. The expandable memory module system includes a primary blade 600 for receiving Sin and for providing Sout. The primary blade 600 is configured in an open loop configuration, similar to the memory blade shown in FIG. 18. Primary memory blade 600 thus provides the received Sin, via interconnected memory devices of primary blade 600, to one other memory blade 602 through port OLout. The OLin port of primary blade 600 receives the output signal of the other memory blade 602, which is propagated through interconnected memory devices of primary memory blade 600 and ultimately output as Sout. The other memory blade 602 is referred to as an expansion blade having serially connected memory devices, and is configured to mate with the open loop connection of the primary blade 600.

The expansion blade 602 can be configured in either a closed loop configuration, or in an open loop configuration to enable interconnection to another expansion blade. Accordingly, because each expansion blade 602 can have an open loop configuration, each expansion blade 602 can be connected to another expansion blade 602, and so forth. Therefore, multiple memory blades can be linked together in a chain, where the last memory blade has a closed loop configuration to ensure that all the memory devices are serially connected between Sin and Sout.

Embodiments of the primary blade 600 and expansion blade 602 are now described.

Figure 20:
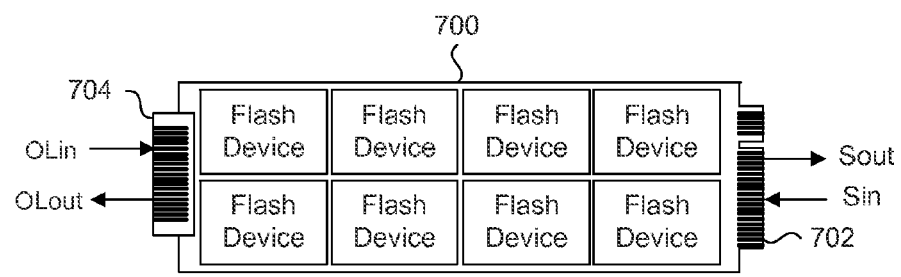
FIG. 20 is a diagram of a primary memory blade with an bridge link, according to an embodiment of the present invention.

FIG. 20 is a diagram of a primary blade with a bridge link, according to a present embodiment. Primary blade 700 includes a PCB with serially connected memory devices mounted on either side thereof. The memory devices are interconnected in an open loop configuration, similar to that shown in FIG. 18 by example. The connector tab 702 of PCB includes electrical terminals corresponding to the Sin input port and Sout output port signals. Located at the opposite side of the PCB is an bridge link 704 for coupling signals between an expansion blade and the primary blade 700. According to the present embodiments, the PCB has signal traces for coupling the output signals of a memory device of primary blade 700 to the OLout port of the PCB and for coupling the input signals received at the OLin port of the PCB to a different memory device of primary blade 700. Both the OLout and OLin ports can be signal lines terminated by electrical terminals near the edge of the PCB and arranged to facilitate connection of the bridge link 704. The bridge link 704 includes a flexible connector, such as, for example, a ribbon connector or flexible circuit tape having integrated wiring that is permanently connected to PCB. In the presently shown example, the bridge link 704 is shown as a ribbon connector.

The free end of such a ribbon connector can be connected to an expansion blade. Alternately, the bridge link 704 can include a socket permanently connected to PCB for releasably receiving a complementary connector (not shown). Such a complementary connector can include a ribbon connector electrically connected to the expansion blade. It will be apparent to one skilled in the art that the flexible connector is not limited to a ribbon.

The primary blade 700 of FIG. 20 is one modular component that is used if an expansion blade is to be connected to it. If there is no requirement for adding an expansion blade, then the primary blade 700 should be changed to a closed loop configuration, to ensure that the all the memory devices mounted thereon are serially interconnected between Sin and Sout. Therefore, a memory blade similar to the ones shown in FIGS. 15 to 17 can be used. Alternately, the presently shown primary blade 700 can be easily converted from the open loop configuration to the closed loop configuration, as will be shown with reference to the embodiment of FIG. 21.

Figure 21:
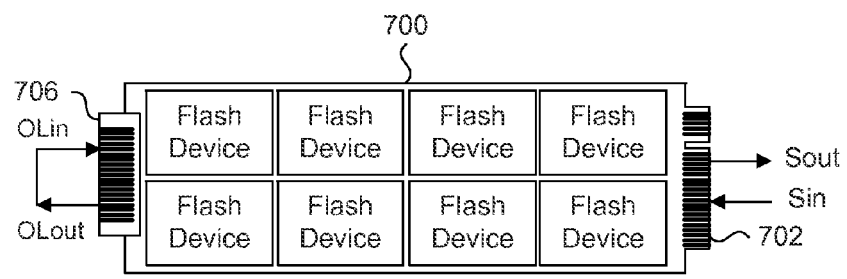
FIG. 21 is a diagram of a primary memory blade with a closed loop bridge link, according to an embodiment of the present invention.

FIG. 21 is a diagram of a primary blade with an bridge link, according to a present embodiment. Primary blade 700 is identical to the one shown in FIG. 20, except for bridge link 706. Bridge link 706 is a loop back connector having integrated wiring for connecting the OLout port to the OLin port. In the presently shown example, the loop back connector 706 is shown as a ribbon connector. In other words the output of a first memory device connected to OLout is directly connected to OLin, which is connected to the input of a second memory device, both of which are mounted to the primary blade 700. This ribbon connected can be permanently connected to the PCB of primary blade 700. Alternatively, if the primary blade 700 uses a socket permanently connected to the PCB of primary blade 700, then the bridge link can include a complementary bridging connector insertable into the socket for connecting OLin to OLout.

An advantage of the primary blade 700 of FIGS. 20 and 21 is the fact that the design and construction of the PCB with the memory devices does not change. For a permanent connection, the manufacturer simply attaches the required ribbon connector to set primary blade 700 in the open loop configuration or the closed loop configuration. For a releasable connection, either the manufacturer or a user simply inserts the required connector into the socket of primary blade 700. In either case, the described connectors are inexpensive to produce, and obviates the need for manufacturing one version of the primary blade in the closed loop configuration, and another version in the open loop configuration.

These same principles can be applied to the expansion blades, as will now be discussed.

Figure 22:
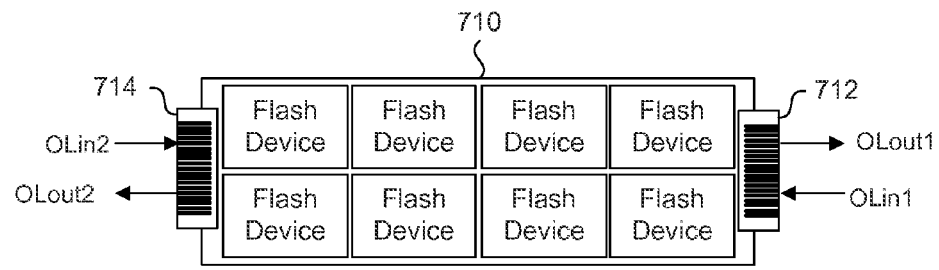
FIG. 22 is a diagram of an expansion memory blade, according to an embodiment of the present invention.

FIG. 22 is a diagram of an expansion memory blade, according to a present embodiment. Expansion blade 710 includes a PCB with serially connected memory devices mounted on either side thereof. The memory devices are interconnected in an open loop configuration, similar to that shown in FIG. 18 by example. In the present embodiment of FIG. 22, the expansion blade 710 includes a first bridge link 712 and a second bridge link 714. As in the previous embodiments, bridge links 712 and 714 can be ribbon connectors, such as the ribbon connector 704 shown in FIG. 20, or alternately they can be sockets permanently connected to the PCB for receiving a connector, such as a ribbon connector. In the present example, the bridge links 712 and 714 are shown as ribbon connectors. In alternate embodiments, a ribbon connector can be permanently connected to the PCB as the first bridge link 712, while a socket can be connected to the PCB as part of the second bridge link 714, or vice versa.

The first bridge link 712 is connected to ports referred to as OLin1 and OLout1, where the ports are terminated signal traces of the PCB that are connected to respective memory devices of expansion blade 710. Accordingly, the bridge link 712 connects the OLin1 and OLout1 ports to OLout and OLin ports respectively, of a primary blade or of another expansion blade. The signals received at the OLin1 port are serially propagated through a set of memory devices connected to the PCB and provided onto the OLout2 port. The signals received at the OLin2 port are serially propagated through another set of memory devices connected to the PCB and provided onto the OLout1 port. Once again, the bridge links 712 and 714 can include sockets permanently connected to the PCB of expansion blade 710.

It should be noted that the OLin and OLout ports of expansion blade 710 can be physically arranged such that either pair of OLin and OLout ports can be connected to the corresponding ports of a primary blade. In other words, while OLout1 and OLin1 can be connected to OLin and OLout, respectively, of primary blade 700, ports OLout 2 and OLin2 can also be connected to OLin and OLout, respectively, of primary blade 700. This reversibility of expansion blade 710 further adds to the modular flexibility of expansion blade 710.

Figure 23:
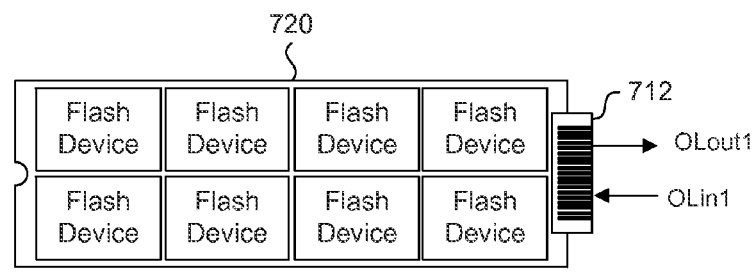
FIG. 23 is a diagram of a closed loop expansion blade, according to an embodiment of the present invention.

According to the present embodiments, multiple expansion blades 710 can be chained to each other to expand the overall storage capacity of the expandable memory module. For example, if ports OLin1 and OLout1 of expansion blade 710 are connected to ports OLout and OLin respectively, of primary blade 700, then ports OLout2 and OLin2 can be connected to ports OLin3 and OLout3 respectively of a third expansion blade. In the event where no further expansion blade is to be connected to expansion blade 710, then the alternate expansion blade 720 of FIG. 23 can be used instead. The expansion blade 720 of FIG. 23 is configured to have a closed loop configuration, such that the channel between OLin1 and OLout1 are connected via serially connected memory devices mounted to the PCB. Such a closed loop configuration of serially connected memory devices on a memory blade can have the same type of configuration shown in the embodiments of FIGS. 15, 16 and 17, by example. Any previously described bridge link can be used, and expansion blade 720 is shown to include a ribbon connector 712.

Figure 24:
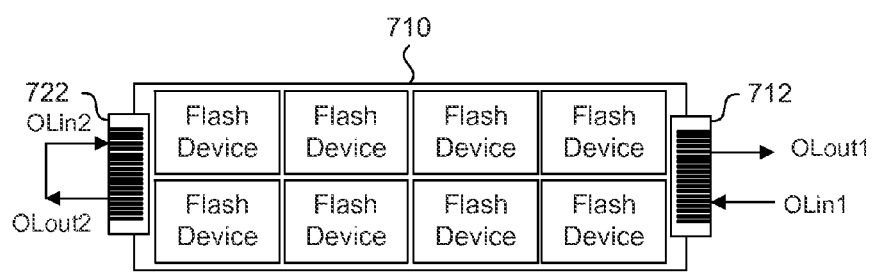
FIG. 24 is a diagram of an open loop expansion blade converted to a closed loop expansion blade, according to an embodiment of the present invention.

The expansion blade 720 of FIG. 23 requires a new PCB design to include signal traces that interconnect OLin1 to OLout1. According to a present embodiment, this redesign can be obviated by converting expansion blade 710 of FIG. 22 from an open loop configuration into a closed loop configuration. As shown in the embodiment of FIG. 24, expansion blade 710 has been converted to have a closed loop configuration by replacing bridge link 714 with a closed loop connector 722. Closed loop connector 722 can be the same as closed loop connector 706 shown in the embodiment of FIG. 21.

Now that the various components of the expandable memory module have been discussed, example expandable memory modules are now described with reference to the embodiments of FIGS. 25 to 34.

FIG. 25 is a diagram of multi-blade expandable memory module having two memory blades, according to a present embodiment. Expandable memory module 800 includes a primary blade 802 and an expansion blade 804. An bridge link 806 in the form of a ribbon connector is connected to both the primary blade 802 and the expansion blade 804 to ensure that all the memory devices are serially connected between the Sin and Sout ports of the connector tab 808. The arrows shown in FIG. 25 indicate the general signal path direction through the memory devices. The primary blade 802 can be the same as primary blade 700 shown in FIG. 20, while the expansion blade 804 can be the same as expansion blade 720 shown in FIG. 23. Alternately, expansion blade 804 can be replaced with expansion blade 710 of FIG. 24. The advantage of using a ribbon connector 806 connected to the short dimensioned side of blades 802 and 804, is that the flexibility thereof enables both blades to be folded towards each other such that one blade overlies another, while maintaining the connection between blades 802 and 804. This is clearly seen in FIG. 26 that shows the front view of the blades 802 and 804 in the folded configuration, creating a stacking arrangement of blades 802 and 804. The ribbon connector 806 is disposed behind the blades, and thus not seen in the front view of FIG. 26.

FIG. 27 is a diagram of an alternate multi-blade expandable memory module having two memory blades, according to a present embodiment. In the previously described embodiments, the bridge links are connected to the short dimensioned side of each blade. As shown in the alternate embodiment of FIG. 27, the expandable memory module 810 includes a primary blade 812 and an expansion blade 814, connected to each other with a ribbon connector 816 along the long dimensioned sides of each blade. Similar to the embodiment of FIG. 25, the memory devices of both blades are now serially interconnected with each other between the Sin and Sout ports of the connector tab 818. FIG. 28 is front view of expandable memory module 810 in the folded configuration, which shows the bent ribbon connector 816. The ribbon connectors 806 and 816 can be of any suitable width to accommodate the number of signal lines being carried. The length of ribbon connectors 806 and 816 is at least long enough to allow a pair of memory blades to attain the folded configuration shown in FIGS. 26 and 28. More specifically, in the configuration with the pair of memory blades are stacked one over the other.

Figure 29:
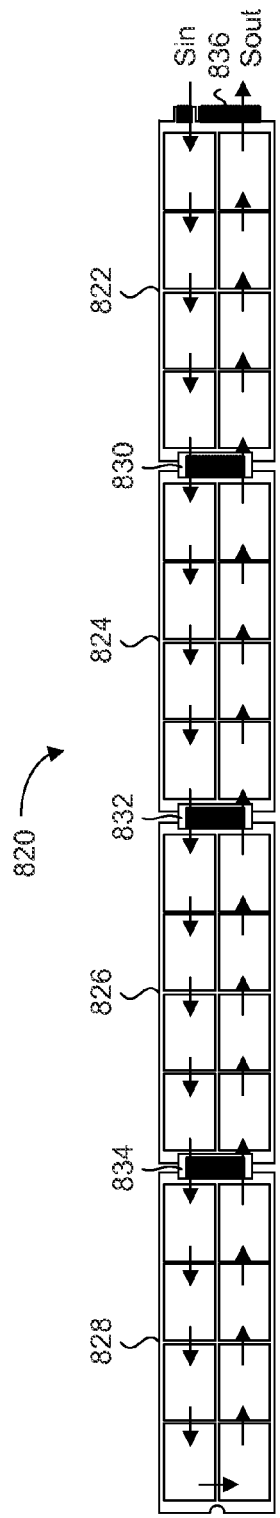
FIG. 29 is a plan view diagram of an expandable memory module having four memory blades, according to an embodiment of the present invention.
Figure 30:
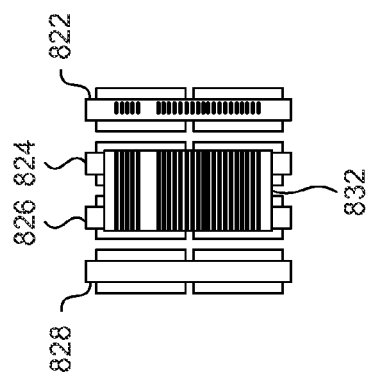
FIG. 30 is a front view diagram of the multi-blade memory module of FIG. 29 in the folded configuration.

FIG. 29 is a diagram of multi-blade expandable memory module having four memory blades, according to a present embodiment. Expandable memory module 820 includes a primary blade 822, a first expansion blade 824, a second expansion blade 826 and a third expansion blade 828. A first bridge link 830 in the form of a ribbon connector is connected to both the primary blade 822 and the first expansion blade 824. A second bridge link 832 in the form of a ribbon connector is connected to both the first expansion blade 824 and the second expansion blade 826. A third bridge link 834 in the form of a ribbon connector is connected to both the second expansion blade 826 and the third expansion blade 828. The ribbon connectors ensure that all the memory devices are serially connected between the Sin and Sout ports of the connector tab 836. The arrows shown in FIG. 29 indicate the general signal path direction through the memory devices. The primary blade 822 can be the same as primary blade 700 shown in FIG. 20, the expansion blades 824 and 826 can be the same as expansion blade 710 of FIG. 22. The expansion blade 828 can be the same as expansion blade 720 of FIG. 23. Alternately, expansion blade 828 can be replaced with expansion blade 710 of FIG. 24. The advantage of using ribbon connectors connected to the short dimensioned side of blades 822, 824, 826 and 828, is that all four blades can be folded towards each other such that one blade overlies another. This is clearly seen in FIG. 30 that shows the front view of the blades 822, 824, 826 and 828 in the folded configuration. While ribbon connector 832 can be seen in the front view of FIG. 30, the ribbon connectors 830 and 834 are disposed behind the blades, and thus not seen in the front view of FIG. 30.

The ability to arrange the memory blades into a folded configuration results in a compact 3-dimensional memory module where memory blades are stacked. The embodiment of FIG. 29 shows one example of how memory blades can be folded into a stack, and can be referred to as an "accordion" fold configuration.

An alternate fold configuration for a multi-blade expandable memory module having four memory blades is shown in the embodiment of FIG. 31. Expandable memory module 840 includes a primary blade 842, a first expansion blade 844, a second expansion blade 846 and a third expansion blade 848. The arrows shown in FIG. 31 indicate the general signal path direction through the memory devices. A first bridge link 850 in the form of a ribbon connector is connected to both the primary blade 842 and the first expansion blade 844. A second bridge link 852 in the form of a ribbon connector is connected to both the primary blade 842 and the second expansion blade 846. A third bridge link 854 in the form of a ribbon connector is connected to both the second expansion blade 846 and the third expansion blade 848. It is immediately noted that the primary blade 842 and the second expansion blade 846 each have two bridge links. Therefore primary blade 842 and the second expansion blade 846 each have two open loop input and output ports. While the data path pattern of each blade may differ from each other, the present embodiment of FIG. 31 illustrates how memory blades with different data path configurations can still be used with each other, provided bridge links are configured such that the signals of the channel are propagated between memory blades when connected with each other. In the example embodiment of FIG. 31, each bridge link ensures that all the memory devices are serially connected between the Sin and Sout ports of the connector tab 856.

The placement of the open loop ports and the bridge links enables the four memory blades to be folded into a stack, as shown in the diagram of FIG. 32. While ribbon connectors 850 and 854 can be seen in the front view of FIG. 32, the ribbon connector 852 is disposed behind the blades, and thus not seen in the front view of FIG. 32.

Figures 33, 34:
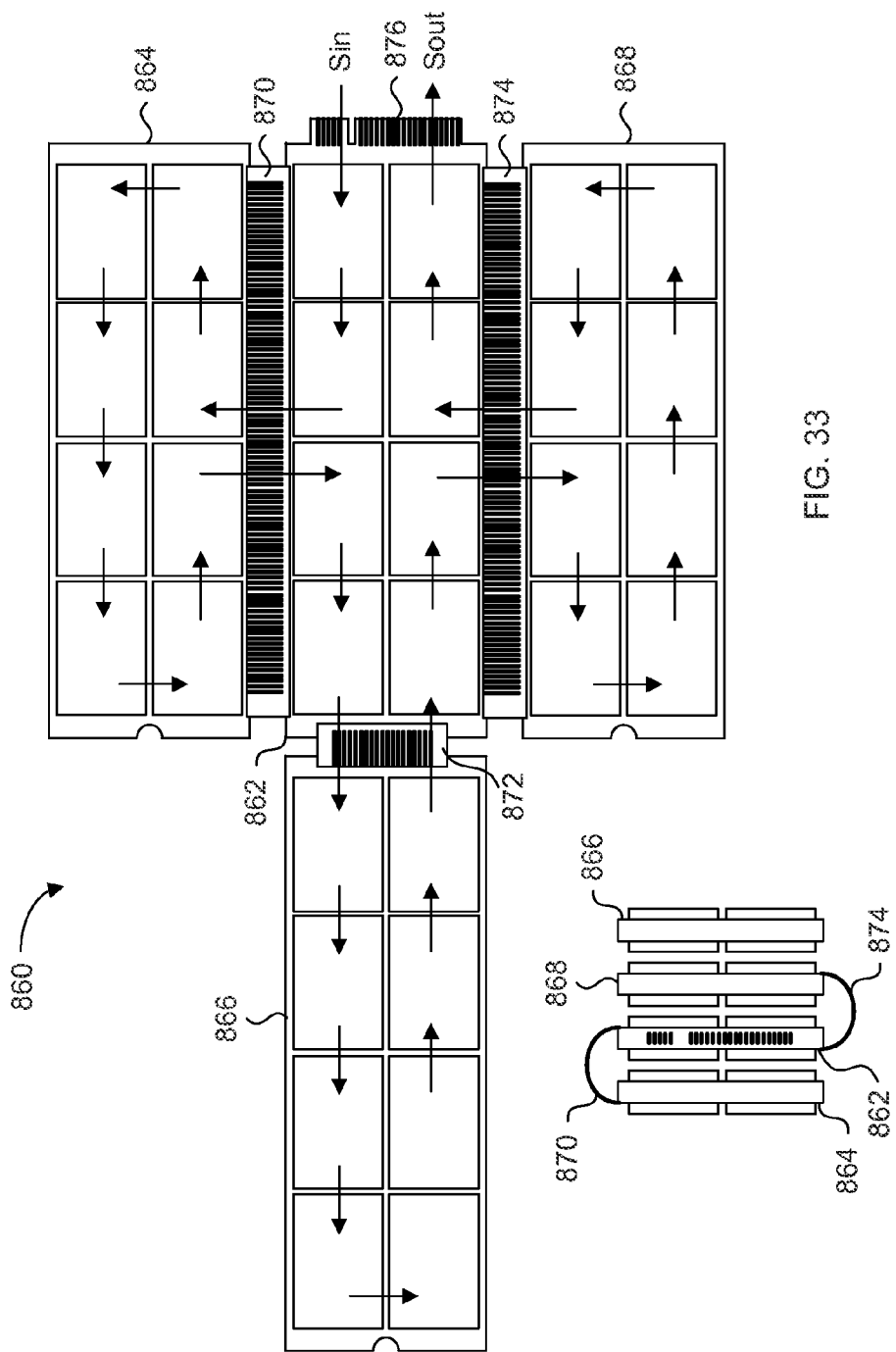
FIG. 33 is a plan view diagram of an alternate expandable memory module having four memory blades, according to an embodiment of the present invention.
FIG. 34 is a front view diagram of the expandable memory module of FIG. 33 in the folded configuration.

An alternate fold configuration for a multi-blade expandable memory module having four memory blades is shown in the embodiment of FIG. 33. Expandable memory module 860 includes a primary blade 862, a first expansion blade 864, a second expansion blade 866 and a third expansion blade 868. The arrows shown in FIG. 33 indicate the general signal path direction through the memory devices. A first bridge link 870 in the form of a ribbon connector is connected to both the primary blade 862 and the first expansion blade 864. A second bridge link 872 in the form of a ribbon connector is connected to both the primary blade 862 and the second expansion blade 866. A third bridge link 874 in the form of a ribbon connector is connected to both the primary blade 862 and the third expansion blade 868.

It is immediately noted that the primary blade 862 has three bridge links. Therefore primary blade 862 has three open loop input and output ports. The data path pattern of expansion blades 864 and 868 are the same, but differ from primary blade 862 and expansion blade 866. The present embodiment of FIG. 33 illustrates how memory blades with different data path configurations can still be used with each other, provided bridge links are configured such that the signals of the channel are propagated between memory blades when connected with each other. In the example embodiment of FIG. 33, each bridge link ensures that all the memory devices are serially connected between the Sin and Sout ports of the connector tab 856.

The placement of the open loop ports and the bridge links enables the four memory blades to be folded into a stack, as shown in the diagram of FIG. 32. While ribbon connectors 870 and 874 can be seen in the front view of FIG. 32, the ribbon connector 872 is disposed behind the blades, and thus not seen in the front view of FIG. 34.

In the previously described embodiments of the expandable memory modules, a bracket or other type of holder can be used to keep the memory blades in their folded configuration, in which the memory blades are stacked over each other. For the embodiments of FIGS. 26 and 28, a bracket sized to keep two stacked blades in the folded configuration can be made of any suitable material, and slipped onto the stacked blades. Optionally, the bracket can be secured to both blades by glue or some other mechanical locking means. For the embodiments of FIGS. 30, 32 and 34, the bracket would be similar to the one used for the embodiments of FIGS. 26 and 28, except that it is sized to keep all four stacked blades together in the folded configuration. The bracket can surround all stacked memory blades, like a band, or it can be open at one end and have a "U" shape.

In the previously described embodiments of the expandable memory modules, a thin heat sink blade can be attached to the exposed top sides of the memory device packages of one memory blade, for the purposes of transferring heat from the memory device packages to the surrounding environment. In the folded configuration, the top sides of memory devices packages of two memory blades would be in contact with the thin heat sink blade. The heat sink blade can include fins and other heat transfer structures which extend from the folded memory blade assembly to further enhance heat transfer to the environment.

In the previously described embodiments of the expandable memory modules, each memory blade can have memory devices mounted to one side or both sides of the PCB, where the memory devices are serially connected in an open loop or closed loop configuration. The signal path direction can be the same for each memory blade of the expandable memory module, or they can each have different signal path directions. The previously described expandable memory module embodiments can employ primary and expandable blades having one or more channels. Each of the previous described expandable memory module embodiments can be used in the SSD systems of FIGS. 12, 13 and 14.

An advantage of some embodiments is that a common PCB design can be used for different types of memory blades, thereby reducing manufacturing costs that can be passed to the end user. Furthermore, different storage capacity expandable memory modules can be produced simply by connecting any number of expansion blades to a primary blade. In the embodiments where the primary and expansion blades use sockets, end users or retailers can assemble their own expandable memory module simply by attaching ribbon connectors to sockets of each pair of memory blades. Therefore expansion of storage capacity no longer requires discarding the old memory module, but simply adding a further expansion blade. Another advantage of using sockets is the ability to swap out a defective memory blade for replacement with a properly functioning memory blade. Otherwise, the entire memory module including properly functioning memory blades would be rendered defective even if there was only one memory device on one memory blade which did not work properly.

All the memory blades shown in the previous embodiments can be inserted into a socket of a corresponding channel. In the previously shown SSD system embodiments of FIGS. 12, 13 and 14, there may be a fixed number of sockets available for receiving a corresponding number of memory blades. Because of the serial nature of the memory devices, any number of memory devices can be inserted to the serial loop signal path of the channel. In other words, the total memory capacity of a memory module is fully expandable. In order to take advantage of this feature of the serial memory devices, such as those disclosed in U.S. Pat. No. 7,652,922, the number of fixed sockets in any SSD system can be expanded with the addition of the memory blade extenders shown in FIGS. 35 and 36.

Figure 35:
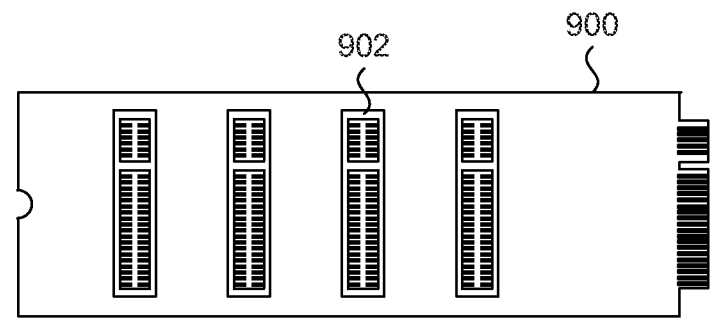
FIG. 35 is a diagram of a memory blade extender, according to an embodiment of the present invention.

FIG. 35 is a diagram of a memory blade extender according to a present embodiment. In FIG. 35, the memory blade extender 900 can have the same form factor as the skinny type memory blade shown in the previous embodiments, or any suitable form factor that can be physically fit within the system case or shell. The presently shown example includes 4 additional sockets 902 attached to the PCB of the memory blade extender 900, but could include more or less sockets. For the SSD system embodiments of FIGS. 12 and 13, replacing an expandable memory module inserted into a motherboard socket with the memory blade extender 900 having 4 sockets adds a total of 3 additional sockets. Thus the removed expandable memory module can occupy one of the 4 sockets of the memory blade extender 900, and 3 more expandable memory modules can be each inserted into one of the 3 additional sockets. In this embodiment, the 4 sockets of the memory blade extender 900 are serially connected with each other. The presently shown memory blade extender 900 is shown having a connector tab, and can be used wherever a primary memory blade is used. In an alternate embodiment, the memory blade extender can be configured as an expansion memory blade, and can be used wherever any of the previously described expansion memory blades are used.

For the SSD system embodiment of FIG. 13, the 4 sockets of the memory blade extender 900 can be configured differently with respect to each other. For example in one configuration, the 4 sockets of the memory blade extender 900 can be serially connected with each other such that the memory capacity of both channels can be increased at the same time with dual channel memory modules connected to the additional sockets of the memory blade extender 900. In an alternate configuration, different sockets of the memory blade extender 900 can be dedicated to one particular channel. For example, 2 of the additional sockets can be serially connected to each other and dedicated to expanding the memory capacity of one channel, while the 2 other additional sockets can be serially connected to each other and dedicated to expanding the memory capacity of the other channel. This can be done by wiring only the signals of one channel to the first pair of additional sockets and wiring only the signals of another channel to the second pair of additional sockets on the PCB. Therefore, single channel memory modules can be used for facilitating flexible expansion of the memory capacity of each channel by different amounts of memory.

Figure 36:
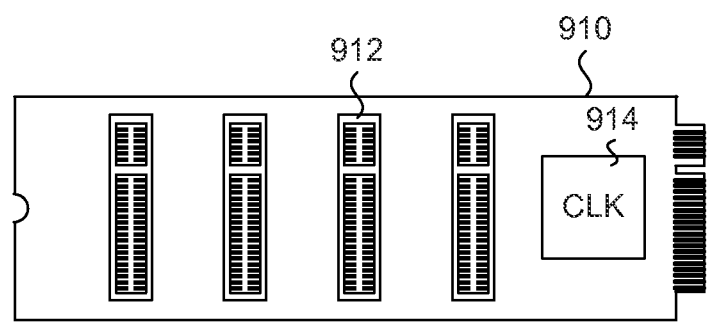
FIG. 36 is a diagram of a memory blade extender with an on-board clock driver, according to an embodiment of the present invention.

FIG. 36 is a diagram of a memory blade extender 910 with 4 sockets 912 and an on-board clock driver 914. Any configuration of the 4 sockets 912 can be used. In this embodiment, the clock driver 914 repeats a received clock signal to one or more sockets 912, depending on the configuration. For example, if the sockets 912 are associated with different channels, then the clock driver 914 drives the clock signals for those respective channels. The clock driver 914 can repeat clock signals received by the memory blade extender 910 and provided by the memory blade extender 910.

An advantage of the memory blade extenders of FIGS. 35 and 36, is that one of the additional sockets of a memory blade extender can receive another memory blade extender, to provide further memory expansion possibilities. In the case where the additional sockets are serially connected to each other and one additional socket is not used for receiving a memory module and expanding the total memory capacity of the channel, a loop-back bypass device is used to maintain electrical connectivity of the wire traces of the memory blade extender with the wire traces of the channel.

In the presently shown embodiments of FIG. 35 in FIG. 36, the additional sockets extended perpendicular direction from the plane of the memory blade. Therefore, inserted memory blades would also extend a perpendicular direction from the plane of the memory blade extender. In alternate embodiments, L-shaped connectors can be used such that a memory blade plane lies parallel to the memory blade extender. These L-shaped connectors can be arranged and oriented in a configuration for maximizing the number of memory blades which can be inserted into the memory blade extender without any physical interference between the memory blades. Therefore if the L-shaped connectors are the same height, then all the memory blades would be coplanar while lying parallel to the memory blade extender. Alternately, L-shaped connectors of different heights can be used to enable stacking of memory blades.

Figure 37:
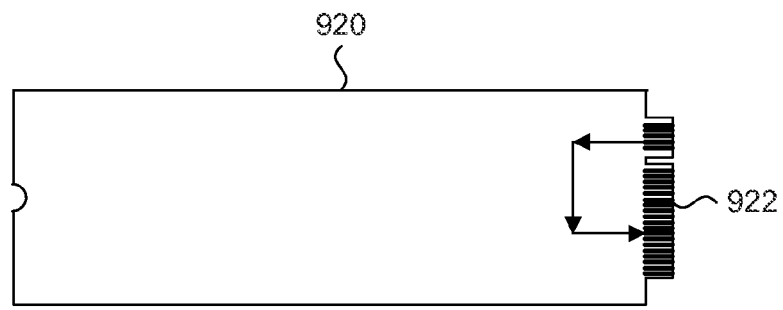
FIG. 37 is a diagram of a passive bypass memory blade, according to an embodiment of the present invention.

FIG. 37 is a diagram of a passive loop-back bypass device, in the form of a memory blade, which can be used for insertion into unused sockets of a channel. The passive bypass memory blade 920 can be used to fill a vacant slot, or socket of a memory blade extender 900. It can also be used to fill a vacant socket of the main SSD system motherboard. The passive bypass memory blade 920 includes signal traces for closing the loop between the Sin and Sout ports of the connector tab 922. The passive bypass memory blade 920 can be shorter in length than a regular memory blade.

Figure 38:
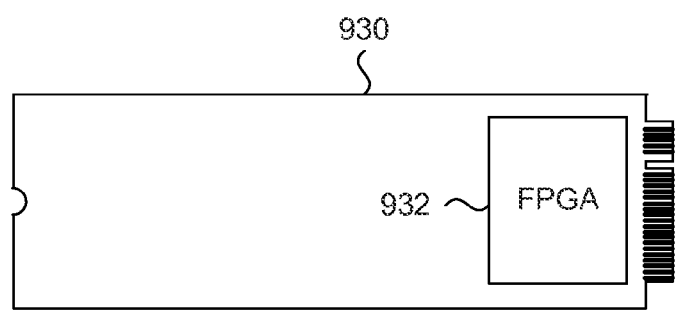
FIG. 38 is a diagram of an active bypass memory blade, according to an embodiment of the present invention; and, FIG. 39 is a diagram of an active bypass memory blade with on-board test logic, according to an embodiment of the present invention.

FIG. 38 is a diagram of an active bypass memory blade 930 that includes a driver circuit 932, in the present example shown as an FPGA, which acts as a signal repeater to overcome connector loading effects which may not be desirable for a particular application. The active bypass memory blade 930 can be used to repeat signals received from one memory blade to another memory blade. Alternately, the active bypass memory blade 930 can be used with one memory blade for driving signals to a memory blade and for driving signals from the memory blade.

Figure 39:
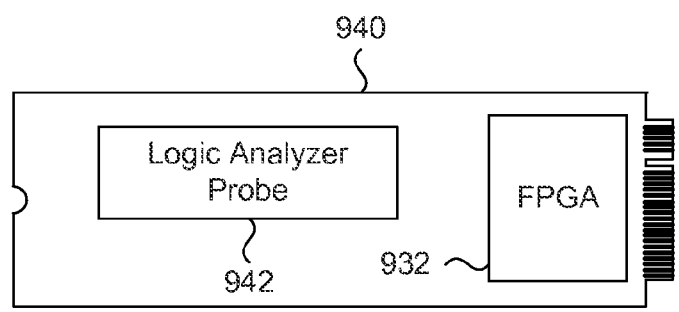

FIG. 39 is a diagram of an active bypass memory blade 940, similar to active bypass memory blade 930, but with on-board test logic circuitry 942 such as a logic analyzer probe, for testing/debugging electrical and/or signal characteristics of the channel it is connected to. Active bypass memory blade 940 can be connected to a socket of the memory blade extender 900 or a socket of the SSD system motherboard. Alternately, in embodiments where the memory blades empty sockets for releasable insertion or attachment of other memory blades, the active bypass memory blade 940 can be attached to the last memory blade of the expandable memory module to test the system or in-line with the other memory blades. An in-line connection means that the active bypass memory blade 940 is serially connected between two memory blades, or a memory blade and the controller or vice versa. In either configuration, the logic analyzer probe 942 can be connected in parallel to the signal lines. Alternately, the logic analyzer probe 942 can be connected to the FPGA, which is configured to provide share the input signals with the logic analyzer probe 942.

The memory blade embodiments of FIGS. 37, 38 and 39 are shown as primary memory blades. In alternate embodiments, each of these memory blades can be implemented as expansion memory blades.

Use of the memory blade extenders is a flexible technique for expanding the total memory capacity of the SSD system. Another technique can be used in conjunction with the memory laid extenders for further increasing the total memory capacity of the SSD system. According to the present embodiments, individual memory blades can be electrically and mechanically connected together in a manner which allows for compact folding of the memory blades into a tight stack, which is then referred to as an expandable memory module.

In the previously described embodiments, the bridge link is shown as a ribbon connector, or a combination of a ribbon connector with corresponding sockets to which the ribbon connector is releasably insertable within. In alternate embodiments, the bridge link can be a rigid connector that restricts the connected blades from any radial movement relative to each other. For example, a rigid connector can be "U" shaped to enable an expansion memory blade to be stacked over a primary memory blade. The expansion memory blade can also have a similar "U" shaped rigid connector to enable a further expansion memory blade to be stacked over it.

In the embodiments described above, the device elements and circuits are connected to each other as shown in the figures, for the sake of simplicity. In practical applications of the present invention, elements, circuits, etc. may be connected directly to each other. As well, elements, circuits etc. may be connected indirectly to each other through other elements, circuits, etc., necessary for operation of devices and apparatus. Thus, in actual configuration, the circuit elements and circuits are directly or indirectly coupled with or connected to each other.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding.

The above-described embodiments are intended to be examples only. Alterations, modifications and variations can be effected to the particular embodiments by those of skill in the art without departing from the scope, which is defined solely by the claims appended hereto.

What is claimed is:

1. A memory module comprising:
at least two memory devices;
a connection interface including an input port and an output port;
a member having signal traces configured to serially connect the at least two memory devices mounted to the member between the input port and the output port of the connection interface.

2. The memory module of claim 1, wherein a first memory device of the at least two memory devices is configured to receive input signals from the input port, and a second memory device of the at least two memory devices is configured to provide output signals to the output port.

3. The memory module of claim 1, wherein
the input port comprises a first channel input port and
the output port comprises a first channel output port, and
the connection interface comprises a second channel input port and a second channel output port.

4. The memory module of claim 3, wherein the member includes further signal traces configured to serially connect additional memory devices mounted to the member between the second channel input port and the second channel output port.

5. The memory module of claim 1, wherein the at least two memory devices includes a first group of memory devices mounted to a first side of the member and a second group of memory devices mounted to a second side of the member.

6. The memory module of claim 5, wherein the signal traces are configured to propagate the input signals from the channel input port through each memory device of the first group of memory devices, and then through each memory device of the second group of memory devices.

7. The memory module of claim 6, wherein
the first group of memory devices includes
a first memory device receiving the input signals from the channel input port, and
a last memory device providing the input signals through to the second side of the member, and
the second group of memory devices includes
a first memory device receiving the input signals from the last memory device of the first group of memory devices, and
a last memory device providing the input signals to the channel output port.

8. The memory module of claim 5, wherein the signal traces are configured to propagate the input signals in a stitching pattern through memory devices of the first group of memory devices and of the second group of memory devices.

9. The memory module of claim 8, wherein a first memory device of the first group of memory devices receives the input signals from the channel input port, and a last memory device of the first group of memory devices provides the input signals to the channel output port.

10. The memory module of claim 1, wherein the member includes a board.

11. A solid state drive system, comprising: a memory controller having a host interface and a channel; a memory module having a connection interface including a channel input port configured to receive input signals from the channel, and a channel output port configured to provide output signals to the channel, and at least two memory devices serially connected between the channel input port and the channel output port.

12. The solid state drive system of claim 11, wherein the memory module includes
a member having signal traces configured to serially connect the at least two memory devices mounted to the member between the channel input port and the channel output port of the connection interface.

13. The solid state drive system of claim 11, wherein the memory module includes
a first board including the connection interface,
N second boards serially connected to each other and the first board, where N is an integer value of at least 1, and
the at least two memory devices are mounted to the first board and the N second boards and serially connected with each other between the channel input port and the channel output port.

14. The solid state drive system of claim 12, wherein the channel is a first channel and the memory controller is configured to include a second channel.

15. The solid state drive system of claim 14, wherein the member includes further signal traces configured to serially connect additional memory devices mounted to the board between the second channel input port and the second channel output port.

16. The solid state drive system of claim 11, wherein the memory module includes signal traces configured to connect the channel input port to the channel output port.

17. The solid state drive system of claim 11, wherein the memory module includes a driver circuit for repeating input signals received at the channel input port to the channel output port.

18. The solid state drive system of claim 17, wherein the memory module includes test logic circuitry configured to test the input signals received at the channel input port.

19. The solid state drive system of claim 12, wherein the member includes a board.

20. A memory module comprising:
a first memory holding member having
a channel input port coupled to an output port by a first set of serially connected memory devices, and
a channel output port coupled to an input port by a second set of serially connected memory devices;
a second memory holding member having
a first port connected to a third set of serially connected memory devices, and
a second port connected to a fourth set of serially connected memory devices; and,
a connector configured to electrically connect the channel output port to the first port and the channel input port to the second port.

21. The memory module of claim 20, wherein the connector includes a flexible connector having
a first end configured to electrically connect to terminals of the output port and the input port of the first memory holding member, and
a second end configured to electrically connect to terminals of the first port and the second port of the second memory holding member.

22. The memory module of claim 21, wherein the first memory holding member is foldable over the second memory holding member in a stacked configuration.

23. The memory module of claim 21, further including
a first socket electrically connected to terminals of an open loop output port and an open loop input port of the first memory holding member,
a second socket electrically connected to terminals of the first port and the second port of the second memory holding member, and
the flexible connector has a first end releasably insertable into the first socket and a second end releasable insertable into the second socket.

24. The memory module of claim 21, further including
a socket electrically connected to terminals of an open loop output port and an open loop input port of the first memory holding member, and
the flexible connector having a first end permanently connected to terminals of the first port and the second port of the second memory holding member, and a second end releasably insertable into the socket.

25. The memory module of claim 21, wherein the flexible connector includes a ribbon connector.

26. The memory module of claim 20, wherein the third set of serially connected memory devices and the fourth set of serially connected memory devices are serially connected between the first port and the second port.

27. The memory module of claim 20, wherein the third set of serially connected memory devices are serially connected between the first port and a third port, and the fourth set of serially connected memory devices are serially connected between the second port and a fourth port.

28. The memory module of claim 27, further including another connector configured to electrically connect terminals of the third port to terminals of the fourth port.

29. The memory module of claim 27, further including a socket connected to terminals of the third port and the fourth port.

30. The memory module of claim 29, further including another connector releasably insertable into the socket and configured to electrically connect terminals of the third port to terminals of the fourth port.

31. The memory module of claim 27, wherein the connector is a first connector, the memory module further including
a third memory holding member having a fifth port connected to a fifth set of serially connected memory devices and a sixth port connected to a sixth set of serially connected memory devices, and
a second connector configured to electrically connect the fifth port to the third port, and the sixth port to the fourth port.

32. A memory module comprising:
a first memory holding member having a connection interface including electrical terminals corresponding to a channel input port and a channel output port;
N second memory holding members serially connected to each other and the first memory blade, where N is an integer value of at least 1;
a plurality of memory devices mounted to the first memory holding member and the N second memory holding members, and serially connected with each other between the channel input port and the channel output port and configured to propagate signals received at the channel input port through each of the plurality of memory devices.

33. The memory module of claim 32, wherein the first memory holding member is connected to one of the N second memory holding members with a flexible connector such that a set of the plurality of memory devices of the first memory holding member are serially connected with another set of the plurality of memory devices of the one of the N second memory holding members through the flexible connector.

34. The memory module of claim 32, wherein the first memory holding member and each of the N second memory holding members are connected to each other as a chain of memory blades with flexible connectors connected between each of the memory holding members, the plurality of memory devices mounted to the first memory holding member and the N second memory holding members being serially connected with each other through the flexible connectors.

35. The memory module of claim 33, wherein the first memory holding member and each of the N second memory holding members are foldable over each other to form a stack.

36. The memory module of claim 35, wherein the first memory holding member and each of the N second memory holding members are foldable in an accordion fold configuration.

37. The memory module of claim 32, wherein one of the N second memory holding members includes a memory extender having at least one socket configured to receive another first memory holding member.

\* \* \* \* \*